(12) United States Patent
Wang et al.

(10) Patent No.: US 11,335,649 B2
(45) Date of Patent: May 17, 2022

(54) LOW IMPEDANCE MULTI-CONDUCTOR LAYERED BUS STRUCTURE WITH SHIELDING

(71) Applicant: VIRGINIA TECH INTELLECTUAL PROPERTIES, INC., Blacksburg, VA (US)

(72) Inventors: Jun Wang, Blacksburg, VA (US); Rolando Burgos, Blacksburg, VA (US); Dushan Boroyevich, Blacksburg, VA (US); Joshua Stewart, Blacksburg, VA (US); Yue Xu, Falls Church, VA (US)

(73) Assignee: VIRGINIA TECH INTELLECTUAL PROPERTIES, INC., Blacksburg, VA (US)

( * ) Notice: Subject to any disclaimer, the term of this patent is extended or adjusted under 35 U.S.C. 154(b) by 73 days.

(21) Appl. No.: 16/879,078

(22) Filed: May 20, 2020

(65) Prior Publication Data

US 2020/0373254 A1 Nov. 26, 2020

Related U.S. Application Data

(60) Provisional application No. 62/850,357, filed on May 20, 2019.

(51) Int. Cl.
*H01L 23/60* (2006.01)
*H01L 23/50* (2006.01)
*H01L 23/522* (2006.01)

(52) U.S. Cl.
CPC .............. *H01L 23/60* (2013.01); *H01L 23/50* (2013.01); *H01L 23/5227* (2013.01)

(58) Field of Classification Search
CPC ...... H01L 23/60; H01L 23/50; H01L 23/5227
See application file for complete search history.

(56) References Cited

U.S. PATENT DOCUMENTS

| 4,430,522 A | * | 2/1984 | Bader | H02G 5/005 174/72 B |
| 2002/0185298 A1 | * | 12/2002 | Rolston | H02G 5/005 174/72 B |

OTHER PUBLICATIONS

Jianing Wang, Shaolin Yu and Xing Zhang, "Effect of key physical structures on the laminated bus bar inductance," 2016 IEEE 8th International Power Electronics and Motion Control Conference (IPEMC-ECCE Asia), Hefei, 2016, pp. 3689-3694.

(Continued)

*Primary Examiner* — Peniel M Gumedzoe
(74) *Attorney, Agent, or Firm* — Thomas | Horstemeyer, LLP.

(57) ABSTRACT

Various embodiments of laminated planar bus structures that minimize electromagnetic interference (EMI) and parasitic inductance are described. In one embodiment, a laminated planar bus structure may include a plurality of stacked conductive layers and a plurality of stacked insulation layers. The plurality of stacked conductive layers may include positive and negative conductive layers, and conductive ground layers stacked as outer layers as to enclose vertically the positive and the negative conductive layers. In another embodiment, the laminated planar bus structure may include a middle ground layer stacked in between the positive and the negative conductive layers to provide additional reduction in electric field strength. A laminated planar bus structure that is integrated with other power electronics components is also presented.

19 Claims, 19 Drawing Sheets

(56) References Cited

OTHER PUBLICATIONS

X. Zhu, D. Su, Y. Zhang and L. Wei, "Bus Bar Design for EMC Performance of Power Converters in Fuel Cell Electric Vehicles," 2006 IEEE International Conference on Vehicular Electronics and Safety, Shanghai, 2006, pp. 144-147.
X. Zhang, H. Zhang, R. Yu and G. Tan, "Planar bus bar optimum design in high-power converters based on FEM analysis," The 2nd International Symposium on Power Electronics for Distributed Generation Systems, Hefei, 2010, pp. 167-170.
K. Wada, "Circuit implementation of power converter for high-speed switching operations," in Chinese Journal of Electrical Engineering, vol. 4, No. 3, pp. 47-52, Sep. 2018.
A. Abrishamifar, R. Lourakzadegan, R. Esmaili and M. Arefian, "Design and construction of a bus bar for spike reduction in an industrial inverter," 2010 1st Power Electronic & Drive Systems & Technologies Conference (PEDSTC), Tehran, Iran, 2010, pp. 13-17.
A. Okubo, K. Throngnumchai and T. Hayashi, "Common mode EMI reduction structure of EV/HEV inverters for high-speed switching," 2017 IEEE Energy Conversion Congress and Exposition (ECCE), Cincinnati, OH, 2017, pp. 2341-2345.
A. Sokolovs and I. Galkins, "Bus Bar construction considerations for Matrix Converters in Integrated AC Drives," 2007 Compatibility in Power Electronics, Gdansk, 2007, pp. 1-4.
C. DiMarino et al., "A Wire-bond-less 10 kV SiC MOSFET Power Module with Reduced Common-mode Noise and Electric Field," PCIM Europe 2018; International Exhibition and Conference for Power Electronics, Intelligent Motion, Renewable Energy and Energy Management, Nuremberg, Germany, 2018, pp. 1-7.
T. Ericsen and A. Tucker, "Power Electronics Building Blocks and potential power modulator applications," in Proc. IEEE International Power Modulator Symp., 1998, pp. 12-15.
T. Ericsen, "Power Electronic Building Blocks-a systematic approach to power electronics," in Proc. IEEE Power Engineer. Society Summer Meeting, 2000, pp. 1216-1218 vol. 2.
T. Ericsen, Y. Khersonsky and P . K. Steimer, "PEBB Concept Applications in High Power Electronics Converters," in Proc. IEEE Power Electron. Special. Conf., 2005, pp. 2284-2289.
Siemens, "HVDC Plus Basics and Principle of Operation," Product document, 2009.
Siemens, "ROBICON Perfect Harmony Medium-Voltage Liquid-Cooled Drives," Product brochure, 2012.
ABB, "ACS5000 Medium Voltage Drive," Product brochure, 2017.
ABB, "ACS2000 Medium Voltage Drive," Product brochure, 2015.
M. Stienekerand R. W. De Doncker, "Medium-voltage DC distribution grids in urban areas," in Proc.IEEE Intern. Symp. on Power Electron. for Distr. Gener. Systems, 2016, pp. 1-7.
J. Millan, P. Godignon, X. Perpina, A. Perez-Tomas, J. Rebollo, "A survey of wide bandgap power semiconductor devices," IEEE Trans. Power Electron., vol. 29, No. 5, pp. 2155-2163, May 2014.
I. Cvetkovic, et al., "Modular scalable medium-voltage impedance measurement unit using 10 kV SiC MOSFET PEBBs," in Proc. IEEE Electric Ship Techn Symp., 2015, pp. 326-331.
I. Celanovic, I. Milosavljevic, D. Boroyevich, R. Cooley and J. Guo, "A new distributed digital controller for the next generation of power electronics building blocks," in Proc. Applied Power Electron. Conf. and Expo., 2000, pp. 889-894 vol. 2.
J. Wang, Z. Shen, R. Burgos, and D. Boroyevich, "Gate driver design for 1.7kV SiC MOSFET module with Rogowski current sensor for shortcircuit protection," in Proc. Applied Power Electron. Conf. and Expo., 2016, pp. 516-523.

J. Wang, Z. Shen, R. Burgos and D. Boroyevich, "Design of a high-bandwidth Rogowski current sensor for gate-drive shortcircuit protection of 1.7 kV SiC MOSFET power modules," in Proc. IEEE Workshop on Wide Bandgap Power Devices and Appl., 2015, pp. 104-107.
J. Wang, Z. Shen, R. Burgos and D. Boroyevich, "Integrated switch current sensor for shortcircuit protection and current control of 1.7-kV SiC MOSFET modules," in Proc. IEEE Energy Convers. Congr. and Expo., 2016, pp. 1-7.
"International standard IEC 60664-1," basic safety publication. Apr. 2007.
R. J. Kaplar, J. C. Neely, D. L. Huber and L. J. Rashkin, "Generation-After-Next Power Electronics: Ultrawide-bandgap devices, high-temperature packaging, and magnetic nanocomposite materials," in IEEE Power Electronics Magazine, vol. 4, No. 1, pp. 36-42, Mar. 2017.
B. Zhang, S. Sudhoff, S. Pekarek and J. Neely, "Optimization of a wide bandgap based generation system," 2017 IEEE Electric Ship Technologies Symposium (ESTS), Arlington, VA, 2017, pp. 620-628.
S. Li, L. M. Tolbert, F. (. Wang and F. Z. Peng, "Stray Inductance Reduction of Commutation Loop in the P-cell and N-cell-Based IGBT Phase Leg Module," in IEEE Transactions on Power Electronics, vol. 29, No. 7, pp. 3616-3624, Jul. 2014.
Texas Instruments, "OMAP decoupling/filtering techniques," Application Report, SPRA906, DSP/EEE Catalog, OMAP Applications, Apr. 2003.
J. Stewart, J. Neely, J. Delhotal and J. Flicker, "DC link bus design for high frequency, high temperature converters," 2017 IEEE Applied Power Electronics Conference and Exposition (APEC), Tampa, FL, 2017, pp. 809-815.
J. Wang et al., "Design and Testing of 6 kV H-bridge Power Electronics Building Block Based on 10 kV SiC MOSFET Module," 2018 International Power Electronics Conference (IPEC-Niigata 2018-ECCE Asia), Niigata, Japan, 2018, pp. 3985-3992.
Cree, "Design Considerations for Designing with Cree SiC Modules Part 2. Techniques for Minimizing Parasitic Inductance," App Note CPRW-AN13, 2013.
Micron, "Bypass capacitor selection for high-speed designs," Technical Note, TN-00-06: Bypass Capacitor Selection Introduction, Rev. D, Mar. 2011.
R. Tarzwell, K. Bahl, "High voltage printed cirucit design & manufacturing notebook," Sierra Proto Express, design guide, Nov. 4, 2004.
C. DiMarino, D. Boroyevich, R. Burgos, M. Johnson and G. -. Lu, "Design and development of a high-density, highspeed 10 kV SiC MOSFET module," 2017 19th European Conference on Power Electronics and Applications (EPE'17 ECCE Europe), Warsaw, 2017, pp. P.1-P.10.
Dupont, "Dupont Kapton Summary of Properties," Datasheet, K-50102-5, Jan. 2017.
J. Lehr, P. Ron, "Foundations of Pulsed Power Technology," Hoboken, NJ: Wiley 2015, pp. 467.
D. Min, et al., "Thickness-dependent DC electrical breakdown of polyimide modulated by charge transport and molecular displacement," MDPI Journal on Polymers, Sep. 2018.
C. DiMarino et al., "Design of a novel, high-density, high-speed 10 kV SiC MOSFET module," 2017 IEEE Energy Conversion Congress and Exposition (ECCE), Cincinnati, OH, 2017, pp. 4003-4010.
C. DiMarino et al., "Fabrication and Characterization of a High-Power-Density, Planar 10 kV SiC MOSFET Power Module," CIPS 2018; 10th International Conference on Integrated Power Electronics Systems, Stuttgart, Germany, 2018, pp. 1-6.

* cited by examiner

US 11,335,649 B2

LOW IMPEDANCE MULTI-CONDUCTOR LAYERED BUS STRUCTURE WITH SHIELDING

CROSS-REFERENCE TO RELATED APPLICATIONS

This application claims priority to, and the benefit of, U.S. Provisional Patent Application No. 62/850,357, entitled "LOW IMPEDANCE MULTI-CONDUCTOR LAYERED BUS STRUCTURE WITH SHIELDING," filed on May 20, 2019, the entire contents of which is fully incorporated herein by reference.

STATEMENT REGARDING FEDERALLY SPONSORED RESEARCH OR DEVELOPMENT

This invention was made with government support under grant number N00014-16-1-2956, awarded by the Office of Naval Research, and under grant number DE-AR0000892, awarded by ARPA-E. The government has certain rights in the invention.

BACKGROUND

Wide bandgap semiconductor devices, such as silicon carbide (SiC), are enabling improved power converter size, weight, and power (SWaP) metrics due to their increased switching capability at a higher blocking voltage. Due to the faster switching times, parasitic inductance in the power loop must be considered to avoid damaging devices due to voltage overshoot. Laminated bus structures are commonly used in medium and high-power converters due to the low parasitic inductance in such structures relative to insulated cables and side-by-side planar bus structures. However, large $$\frac{di}{dt} \text{ and } \frac{dv}{dt}$$

during commutation processes cause not only over-voltage and over-current stresses, but also electromagnetic interference (EMI). Thus, previous works have largely focused on controlling EMI by reducing parasitic inductance and the careful selection of insulation material, but those approaches can induce safety tradeoffs.

BRIEF DESCRIPTION OF THE DRAWINGS

Many aspects of the present disclosure can be better understood with reference to the following drawings. The components in the drawings are not necessarily to scale, with emphasis instead being placed upon clearly illustrating the principles of the disclosure. Moreover, in the drawings, like reference numerals designate corresponding parts throughout the several views.

DETAILED DESCRIPTION

Devices constructed from III-V semiconductor materials, such as silicon carbide (SiC) and gallium nitride (GaN), offer promising alternatives to silicon (Si). Compared to Si, these devices have a higher bandgap, which leads to their classification as wide-bandgap (WBG) semiconductor devices. The critical electric field for avalanche breakdown is dependent on bandgap by a second or third power law, depending on the device type and its applicable figure of merit (FOM). This FOM compares breakdown voltage to an area-normalized specific on-resistance. Additionally, they provide the benefit of higher temperature operation and higher switching frequency.

Power systems are rapidly changing due to the introduction of these WBG devices. Higher power density is achievable not only through the reduction in size of the cooling system, but also through reduction in the size of passive components at a higher switching frequency. Certain devices, such as 10 kV SiC MOSFET modules, are enabling medium voltage DC (MVDC) converter design targeting switching frequencies in excess of 40 kHz. In order to leverage the benefits offered by WBG devices, the entire system must be redesigned, and Si components cannot simply be swapped out with their WBG counterparts. To achieve a higher switching frequency or frequencies, parasitic inductance should be minimized to the extent possible. Parasitic inductance in the power loop stores energy as current passes through, and energy is released during turnoff causing a transient voltage spike. The overshoot voltage $V_{os}$ is a function of parasitic inductance L and the rate of change in current $$\frac{di}{dt}$$

as shown by the equation below:

$$V_{os} = L\frac{di}{dt} \quad (1)$$

The bus structures presented herein can be used to connect various components in a power loop while providing the lower effective inductance for a power converter system. Different embodiments of the bus structures are disclosed, including a traditional laminated planar bus structure and a PCB-based laminated bus structure. The embodiments of the bus structures utilize stacked laminated conductors, which have the effect of cancelling mutual inductance by opposing magnetic fields created by current flowing in opposite directions. Additional conductive ground layers can further serve as electromagnetic interference (EMI) shields. These embodiments provide benefits such as reduced EMI and parasitic inductance, when compared to, for example, a two-layer bus structure, for further miniaturization of the bus structures by allowing sensitive electronic components to be placed much closer to the bus structures.

Figure 1:
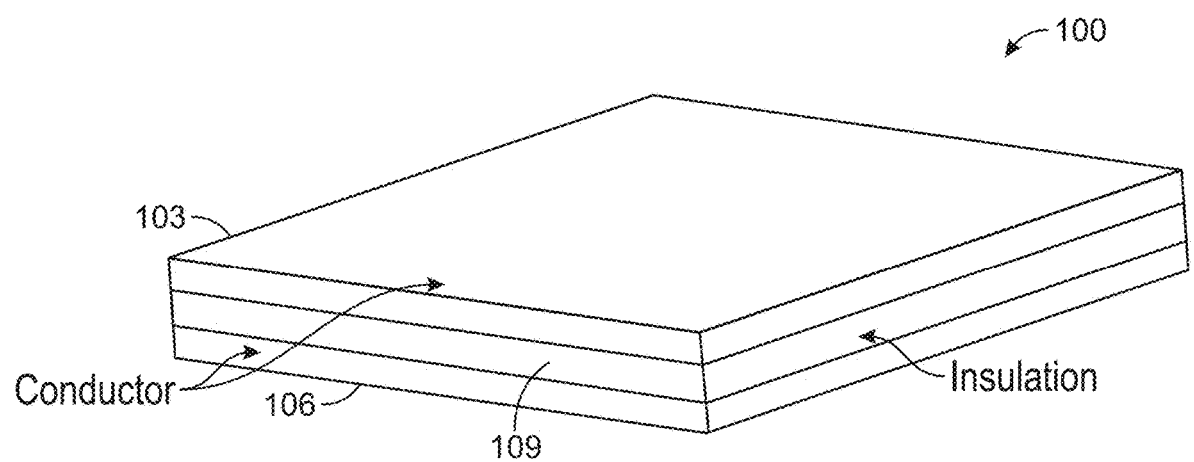
FIG. 1 illustrates an example two-layer planar bus structure with an insulation layer between two conductive layers.

Turning now to the drawings, FIG. 1 illustrates an example two-layer planar bus structure 100 with an insulation layer 109 stacked between a first or positive conductive layer 103 and a second or negative conductive layer 106. In the bus structure 100, a voltage potential can be applied to or across the conductive layers 103 and 106, with a higher potential at the positive conductive layer 103 and a lower potential at the negative conductive layer 106. There are no conductive ground layers in contrast with the embodiments of this disclosure described below.

Figure 2:
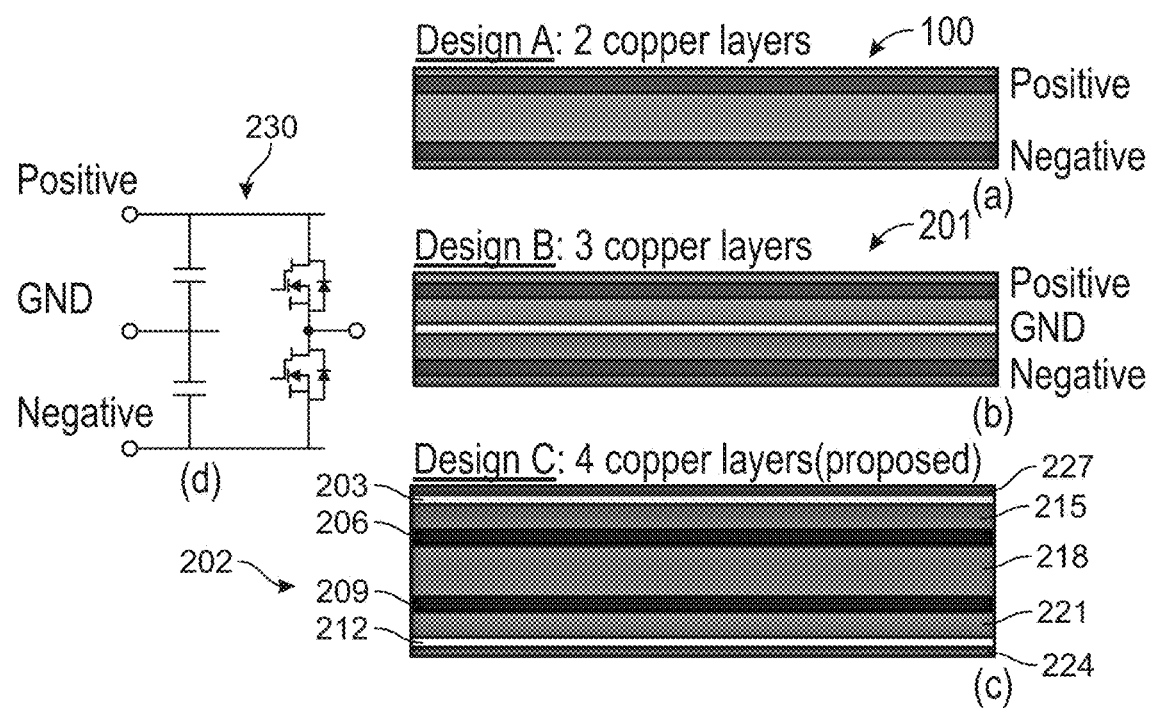
FIG. 2 illustrates three different planar bus structures, each having a different number of conductive layers.

FIG. 2 illustrates three different bus structures, which are laminated and planar, but with different number of conductive layers. The bus structure 100 includes two conductive layers 103 and 106 and an insulation layer 109 separating the two conductive layers 103 and 106, as discussed above. The bus structure 201 includes a positive conductive layer, a negative conductive layer, and a ground layer between the positive and the negative conductive layers. The bus structure 202 includes four conductive layers. The layers of the bus structure 202 include a positive conductive layer 206, a negative conductive layer 209, a ground layer 203 stacked over the positive conductive layer 206, and a ground layer 212 stacked under the negative conductive layer 209. The bus structure 202 also includes a plurality of insulation layers, including insulation layer 227 stacked over the ground layer 203, insulation layer 215 separating the ground layer 203 and the positive conductive layer 206, insulation layer 218 separating the positive conductive layer 206 and the negative conductive layer 209, insulation layer 221 separating the negative conductive layer 209 and the ground layer 212, and insulation layer 224 stacked under the ground layer 212. The circuit diagram 230 illustrates how the positive, negative, and ground layers of a bus structure may be electrically connected or coupled in a power stage of a power converter.

Figure 3:
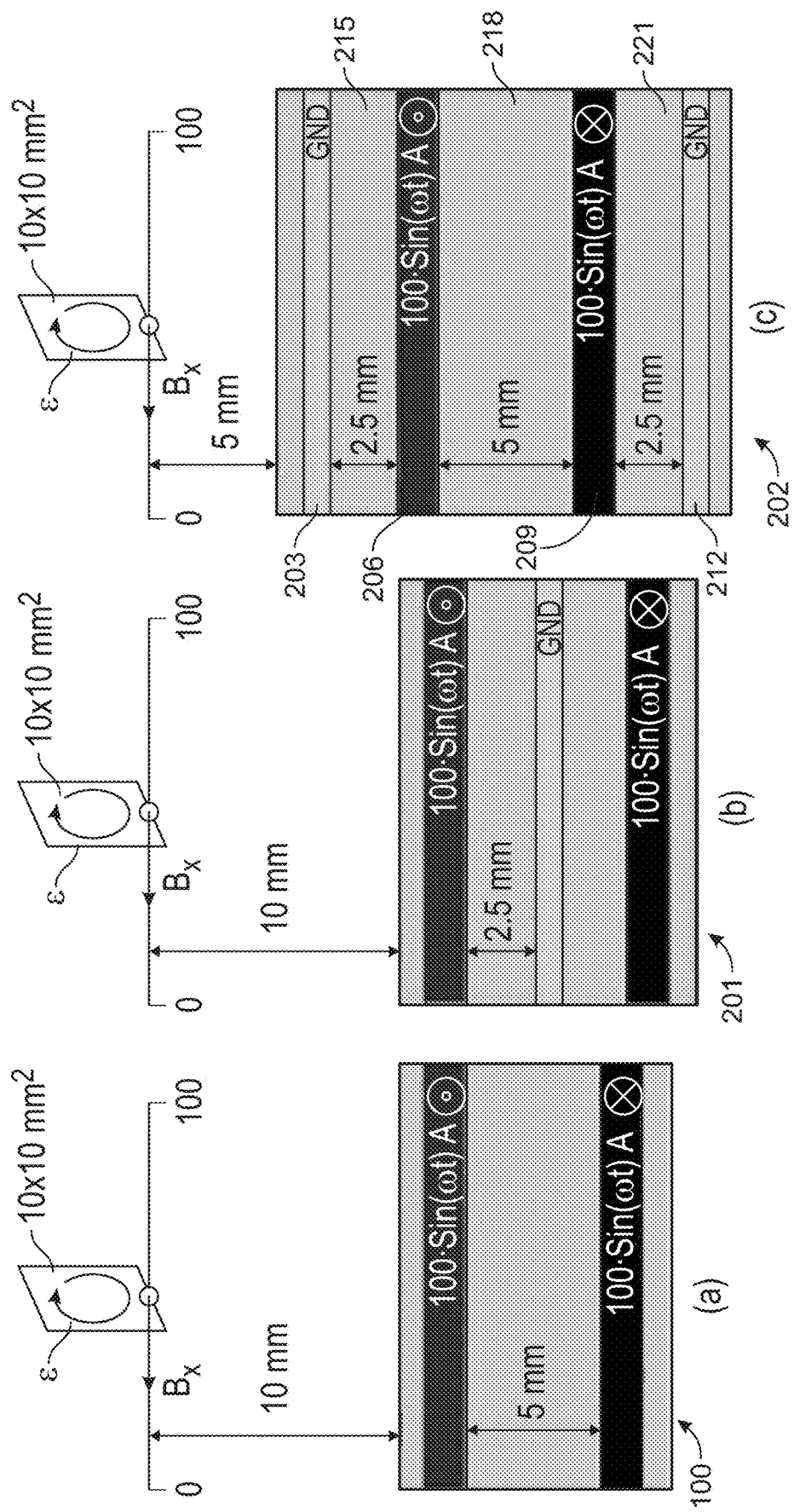
FIG. 3 illustrates flux density measurement locations of the three different planar bus structures shown in FIG. 2.

FIG. 3 illustrates flux density measurement locations of the three bus structures 100, 201, and 202 shown in FIG. 2, to analyze flux density $B_x$ at specified locations above each bus structure 100, 201, and 202. Example thicknesses of the dielectric layers for each of the bus structures 100, 201, and 202 are shown. The bus structure 100 includes an insulation layer that is 5 millimeters (mm) thick between the positive and negative conductive layers. The bus structure 201 includes an insulation layer that is 2.5 mm thick between the positive conductive layer and the ground layer and an insulation layer that is 2.5 mm thick between the ground layer and the negative conductive layer. The bus structure 202 includes an insulation layer 215 that is 2.5 mm thick, an insulation layer 218 that is 5 mm thick, and an insulation layer 221 that is 2.5 mm thick. Each conductive layer in bus structures 100, 201, and 202 can include copper that is 1.5 mm thick, as one example, although other metals and thicknesses of metals are within the scope of the embodiments.

Insulation layers generally include substances which do not conduct electric current such as fiberglass, Teflon®, ceramics, and certain polymers. These layers may include, as non-limiting examples, flame resistant substrates such as FR-2 and FR-4, radio-frequency (RF) substrates, Arlon®, flexible substrates such as such as Kapton®, Upilex®, and Pyralux®. Additional non-limiting examples may include insulating materials such as Nomex®, Tedlar®, Mylar®, Ultem®, Mylar/Tedlar, Tedlar/Mylar/Tedlar, Valox®, epoxy-glass, heatshrink tubing, and epoxy powder coating.

With ground layers 203 and 212 stacked as outer layers of bus structure 202, over and under the positive conductive layer 206 and the negative conductive layer 209, respectively, the insulation layer 218 between the positive conductive layer 206 and the negative conductive layer 209 is thicker than the insulation layers 215 and 221 because it should avoid breakdown against at least the full nominal bus operating voltage in addition to any ripple, transients, and operating voltage deviations.

In a finite element analysis (FEA) simulation conducted with bus structures 100, 201, and 202, electric field stress was assumed to be uniform at 2 kV/mm. In the simulation, the positive conductive layer 206 for the bus structure 202 and the positive conductive layers for the bus structures 100 and 201 were excited by a 100 A amplitude AC current source. The negative conductive layer 209 for the bus structure 202 and the negative conductive layers for the bus structures 100 and 201 were also excited by the same current source but in the opposite direction. Ground layers 203 and 212 of the bus structure 202 and the ground layers for the bus structures 100 and 201 were not excited by any sources.

The purpose of this simulation was to observe and compare the induced X-axis flux density $B_x$ at specified locations in FIG. 3 and to assess the inducted electromotive force (EMF) ε when the flux density is integrated over a window area of 10×10 mm² at the specified locations. To ensure a fair comparison for high-density design, the flux measurement location is defined for a similar overall size considering bus structure thickness. Therefore, the flux density $B_x$ measurement distance of the bus structure 202 is closer or shorter than the flux density $B_x$ measurement distances of the bus structures 100 and 201. The flux density $B_x$ measurements were taken at 10 mm above the bus structures 100 and 201 and at 5 mm above the bus structure 202.

Figure 4A:
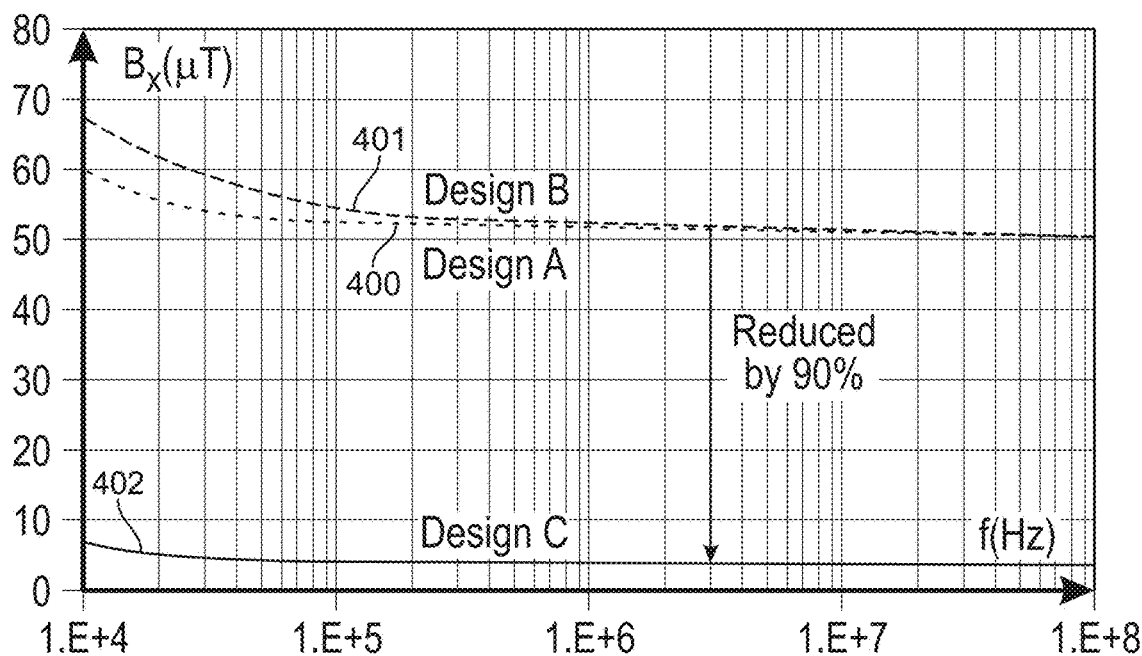
FIG. 4A is a graphical illustration of flux density $B_x$ measurements at the locations shown in FIG. 3 according to a simulation.

FIG. 4A shows the flux density $B_x$ measurement results at the flux density $B_x$ measurement locations shown in FIG. 3 for the bus structures 100, 201, and 202 in a FEA simulation. Flux density $B_x$ measurement results for the bus structure 100 is denoted by reference number 400, 401 for the bus structure 201, and 402 for the bus structure 202. The simulation considers fringe effects. The ground layers 203 and 212 of the bus structure 202 serve as two shielding planes that reduce the radiated flux density $B_x$ of the bus structure 202 by approximately 48 µT as compared to radiated flux density $B_x$ measurements of the bus structures 100 and 201, which is about a 90% reduction.

Figure 4B:
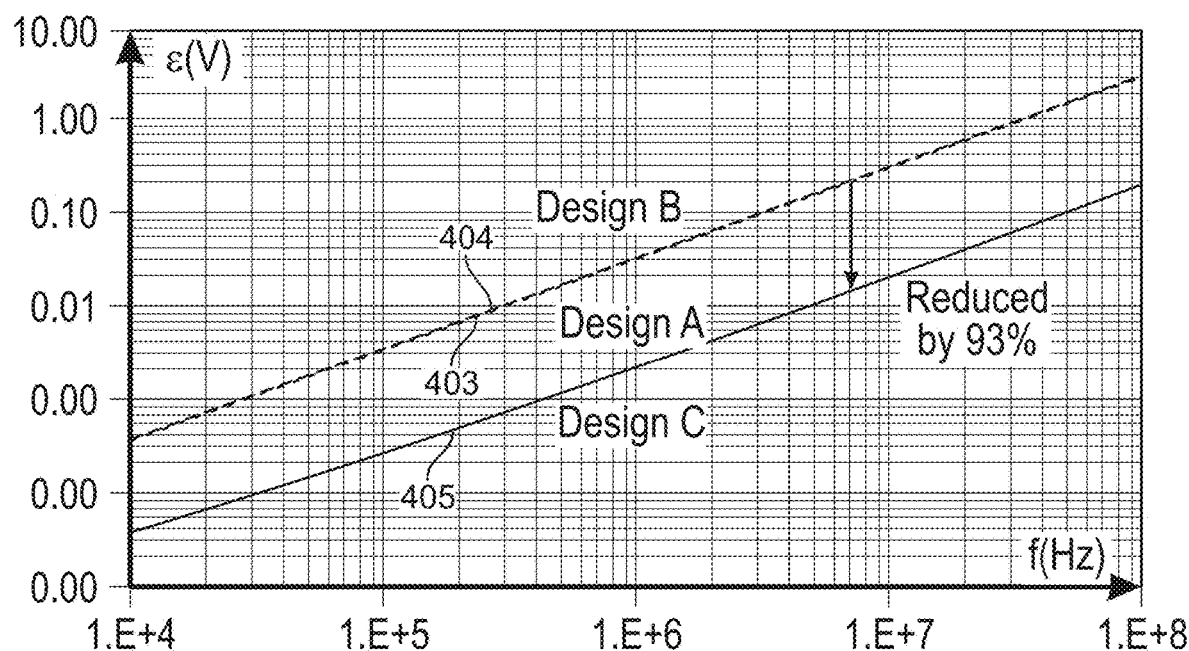
FIG. 4B is a graphical illustration assessing induced electromotive force (EMF) ε for the three bus structures shown in FIG. 2 according to the simulation performed in FIG. 4A.

FIG. 4B shows induced electromotive force (EMF) ε for the bus structures 100, 201, and 202 based on the simulation performed for the results in FIG. 4A when the flux density $B_x$ is integrated over a window area of 10×10 mm². Induced EMF ε measurement results for the bus structure 100 is denoted by reference number 403, 404 for the bus structure 201, and 405 for the bus structure 202. Significant induced EMF ε for the bus structures 100 and 201 was detected with a magnitude of 0.3 V at 10 MHz for a 100 mm² circuit loop area. The structure and layout of the bus structure 202 demonstrates superior performance compared to the bus structures 100 and 201 in reducing the EMF by 14 times, or about 93%.

Figure 5:
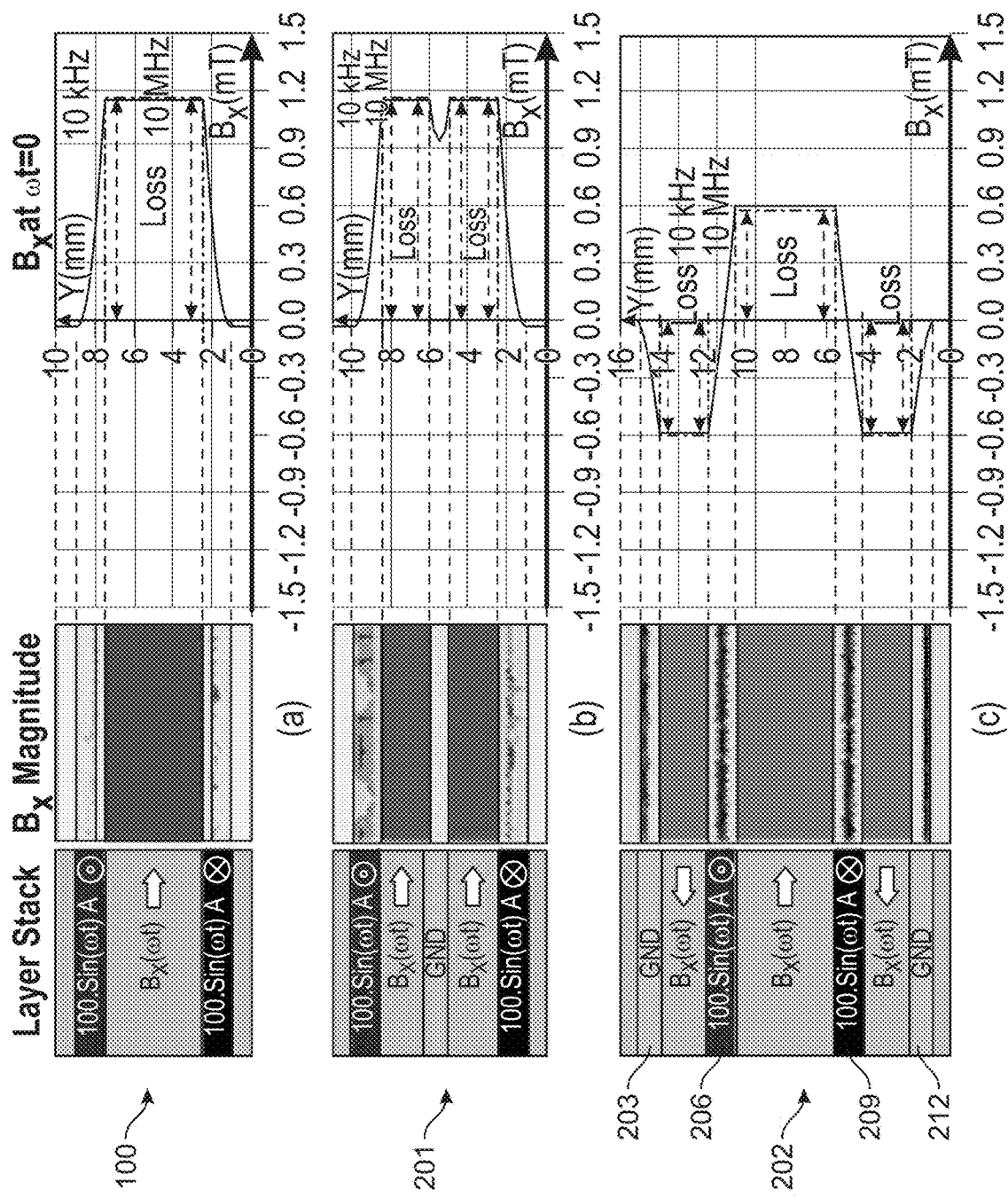
FIG. 5 is a graphical illustration showing a comparison of magnetic flux inside the conductive layers for the three bus structures shown in FIG. 2 according to a simulation.

FIG. 5 shows total Eddy current loss comparisons between the bus structures 100, 201, and 202 based on the simulation setup for these three bus structures. Most of the generated flux concentrates on non-metal materials, but a small part of the flux can still penetrate into a small skin-depth of conductors to cause Eddy current losses that are determined by magnitude of flux density $B_x$. The flux density $B_x$ magnitude is compared between the bus structures 100, 201, and 202 at 10 kHz, and the flux density $B_x$ magnitude at ωt=0 is compared at 10 kHz and 10 MHz. The results show in the top and middle graphs that the bus structures 100 and 201 have similar $B_x$ loss profiles along the Y-axis. However, the bus structure 201 has some additional flux penetrating into the ground layer of the bus structure 201 which caused extra losses.

The results show that the flux density $B_x$ magnitude for the bus structure 202 is reduced nearly by half and evenly distributed throughout the surfaces of the conductive layers 203, 206, 209, and 212. Polarities of the flux density $B_x$ magnitude on the top and bottom surfaces of the positive conductive layer 206 and the negative conductive layer 209 are opposite because of the impact from the two ground layers 203 and 212.

Figure 6:
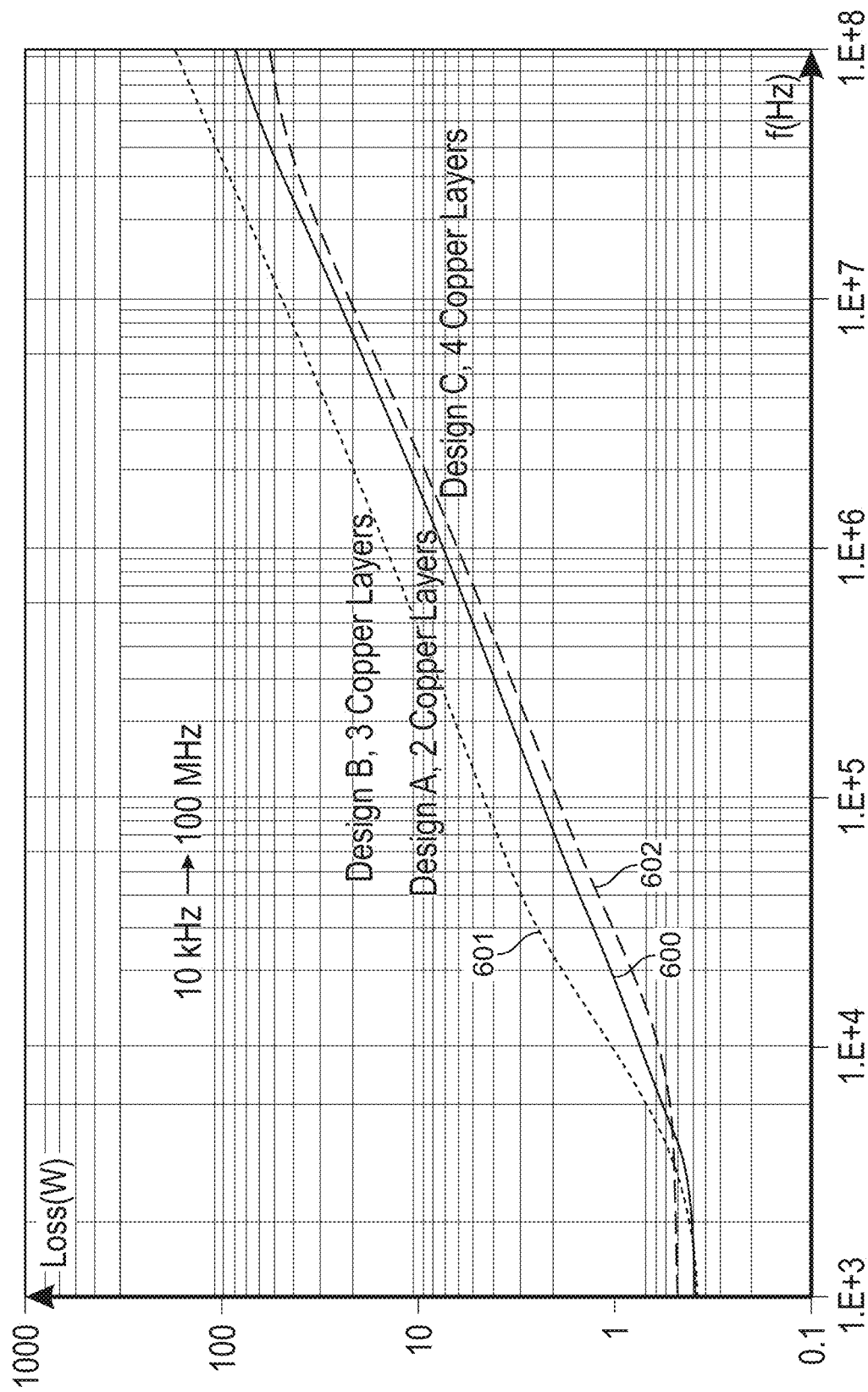
FIG. 6 is a graphical illustration of total Eddy current loss for the three bus structures shown in FIG. 2 according to a simulation.

FIG. 6 shows the total Eddy current loss comparison of the three bus structures 100, 201, and 202. Eddy current loss for the bus structure 100 is denoted by reference number 600, 601 for the bus structure 201, and 602 for the bus structure 202. As shown in the results, the bus structure 202 shows minimum total Eddy current loss, in watts (W), as compared to the bus structures 100 and 201 from 10 kHz to 100 MHz, which is the dominant frequency range for SiC MOSFETs that switch at above 10 kHz.

Figure 7A:
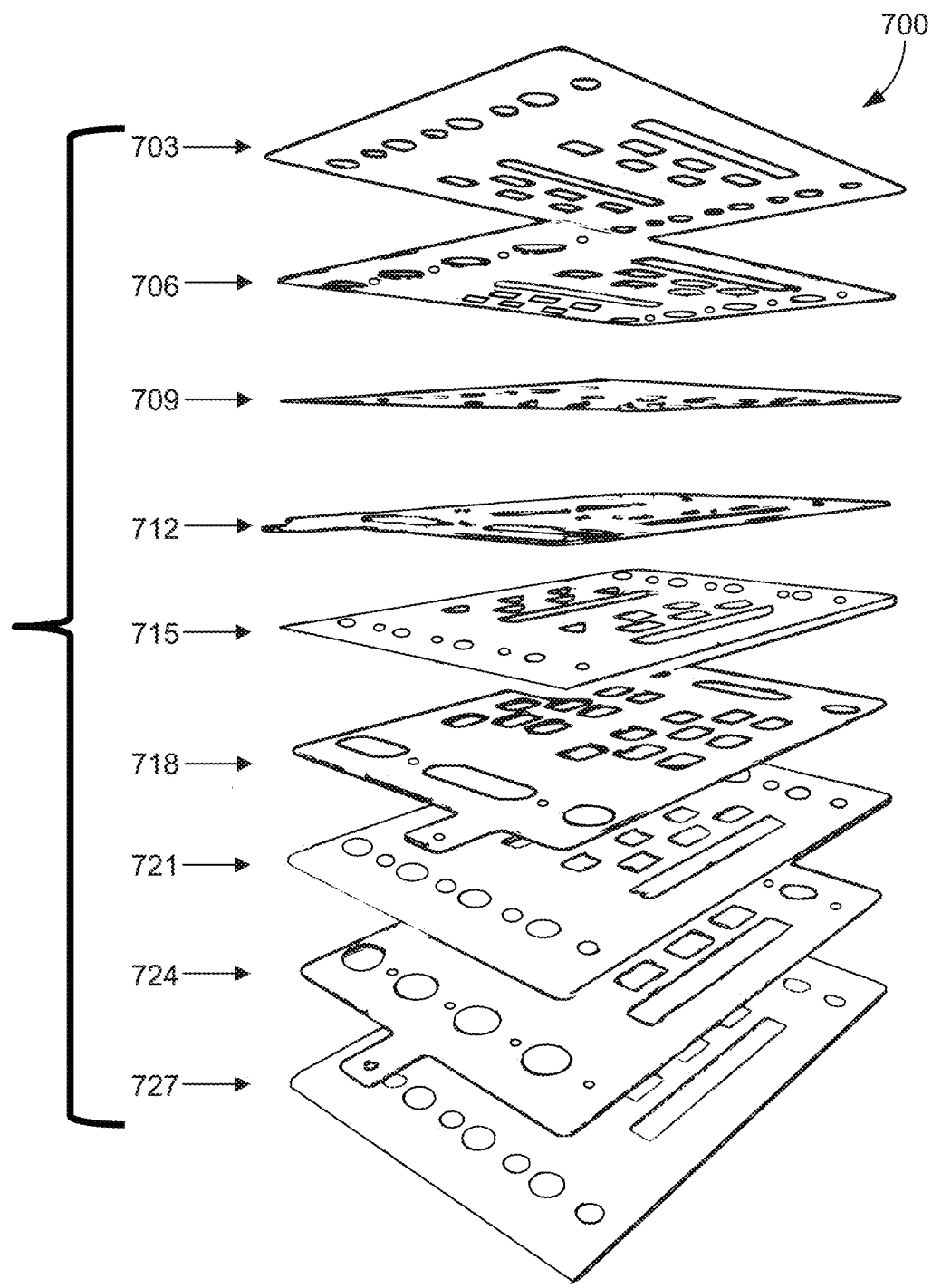
FIG. 7A illustrates an exploded view of a bus structure with 4 conductive layers according to various embodiments of this disclosure.

FIG. 7A shows an exploded view of the layer structure of a planar bus structure 700, utilizing copper layers and dielectric layers according to an embodiment of the present disclosure. The bus structure 700 can be used to connect various components in a power loop while providing low effective inductance for the system. The layer arrangement of the bus structure 700 is substantially similar to that of the bus structure 202, with a plurality of conductive layers and a plurality of dielectric layers. The bus structure 700 includes a positive conductive layer 712, a negative conductive layer 718 stacked under the positive conductive layer, and conductive ground layers 706 and 724, which are stacked over and under the positive 712 and the negative 718 layers, respectively. The positive conductive layer 712 may be positive with respect to the conductive ground layers 706 and 724, and the negative conductive layer 718 may be negative with respect to the ground layers 706 and 724. The positive conductive layer 712 may have a greater potential than the ground layers 706 and 724, and the negative conductive layer 718 may have a potential less than the ground layers 706 and 724.

The bus structure 700 also includes dielectric layer 709 separating the ground layer 706 and the positive conductive layer 712, dielectric layer 715 separating the positive conductive layer 712 and the negative conductive layer 718, and dielectric layer 721 separating the negative conductive layer 718 and the ground layer 724. The bus structure 700 also includes a dielectric layer 703 stacked over the ground layer 706 and a dielectric layer 727 stacked under the ground layer 724. The bus structure 700 may include additional conductive layers with differing potentials from those of the conductive layers 712, 718, 706, and 724, and such modifications are within the scope of this disclosure.

The bus structure 700 may be formed with various materials and substances for the conductive layers and the dielectric layers. For the conductive layers 706, 712, 718, and 724, a conductive metal such as copper can be used. However, other suitable conductive metals such as aluminum or copper alloys may be used. The dielectric layers 703, 709, 715, 721, and 727 may generally include substances which do not conduct electric current such as fiberglass, Teflon®, ceramics, and certain polymers. These layers may include, as non-limiting examples, flame resistant substrates such as FR-2 and FR-4, radio-frequency (RF) substrates, Arlon®, flexible substrates such as such as Kapton®, Upilex®, and Pyralux®. Additional non-limiting examples may include insulating materials such as Nomex®, Tedlar®, Mylar®, Ultem®, Mylar/Tedlar, Tedlar/Mylar/Tedlar, Valox®, epoxy-glass, heatshrink tubing, and epoxy powder coating.

Figure 7B:
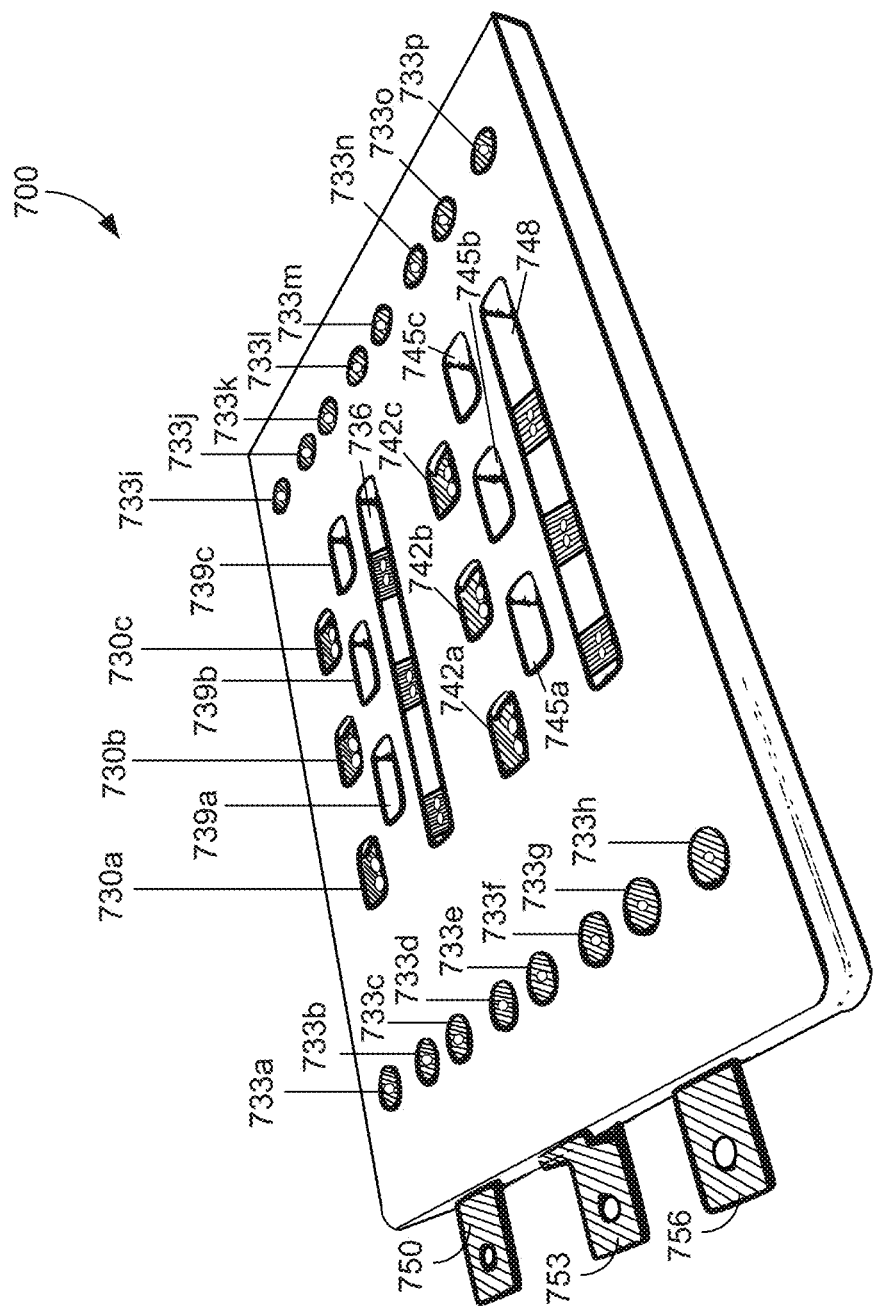
FIG. 7B illustrates a perspective view of the bus structure shown in FIG. 7A outlining a plurality of apertures with exposed conductors.

FIG. 7B shows a perspective view of the bus structure 700. As shown, the bus structure 700 includes a plurality of exposed apertures 730a-730c and 742a-742c, which have portions of the positive conductive layer 712 exposed. These exposed apertures 730a-730c and 742a-742c may be used as connection points for power modules, such as SiC XHV-6 MOSFET power modules, among others, to connect to a positive DC voltage. Each exposed aperture from 730a-730c and 742a-742c includes two circular holes which penetrate the positive conductive layer 712 to facilitate connection between the power modules and the positive conductive layer 712.

Elongated apertures 736 and 748 also have a portion of the negative conductive layer 718 exposed so that the power modules may use apertures 736 and 748 as connection points to connect to a negative DC voltage. Each elongated aperture from 736 and 748 includes three sets of exposed conductors from the negative conductive layer 718. Each set of exposed conductors of the negative conductive layer 718 includes two circular holes, which penetrate the negative conductive layer 718 to facilitate connection between the power modules and the negative conductive layer 718.

The elongated apertures 736 and 748, and the exposed apertures 730a-730c and 742a-742c, may be accessed by the power modules from a top side of the bus structure 700 or a bottom side of the bus structure 700. For example, the power modules may connect to the positive conductive layer 712 through the exposed apertures 730a-730c from above the dielectric layer 703. In another example, the power modules may connect to the positive conductive layer 712 through the exposed apertures 730a-730c from below the dielectric layer 727. Similarly, the power modules may connect to the negative conductive layer 718 through the elongated apertures 736 and 748 from above the dielectric layer 703 and/or below the dielectric layer 727

The bus structure 700 also includes a plurality of circular apertures 733a-733p, which have a portion of the positive conductive layer 712 exposed. The circular apertures 733a-733p may be used as connection points by passive components, such as decoupling capacitors, to connect to the positive conductive layer 712. Each circular aperture out of 733a-733p includes a hole penetrating the positive conductive layer 712 to facilitate connection between passive components such as capacitors and the positive conductive layer 712.

The plurality of circular apertures 733a-733p may be accessed by the passive components such as capacitors from the top side of the bus structure 700 or the bottom side of the bus structure 700. For example, a plurality of decoupling capacitors may connect to the positive conductive layer 712 through circular apertures 733i-733p from above the dielectric layer 703, while another plurality of decoupling capacitors may connect to the positive conductive layer 712 through circular apertures 733a-733h from below the dielectric layer 727, and vice versa. In some embodiments, a plurality of decoupling capacitors may connect to the positive conductive layer 712 through circular apertures 733a-733p from above the dielectric 703 and/or below the dielectric layer 727.

Passthrough holes 739a-739c and 745a-745c are throughholes along an entire thickness of the bus structure 700 without any exposed conductors. The passthrough holes 739a-739c and 745a-745c may be used by smart gate drivers to make a direct connection to the power modules connected to the positive conductive layer 712 and the negative conductive layer 718. For example, the smart gate drivers may use the passthrough holes 739a-739c and 745a-745c from above the dielectric layer 703 to connect directly into the power modules located below the dielectric layer 727. In some embodiments, the smart gate drivers may use the passthrough holes 739a-739c and 745a-745c from below the dielectric layer 727 to connect directly into the power modules located above the dielectric layer 703.

The bus structure 700 includes a positive DC bus terminal 750, which is an exposed conductor of the positive conductive layer 712. Ground bus terminal 753 is an exposed conductor of the conductive ground layers 706 and 724. Negative DC bus terminal 756 is an exposed conductor of the negative conductive layer 718. However, it is important to note that some embodiments may incorporate the bus terminals 750, 753, and 756 that are bent instead of straight, or may exclude the bus terminals 750, 753, and 756 altogether.

Partial discharge inception voltage (PDIV), which is the voltage required to cause a localized breakdown within an insulator above a specified threshold, targeted for bus structure 700 was 7 kV with an apparent charge limit set at approximately <10 pC. However, a subsequent partial discharge (PD) testing measured >800 pC at just 5.23 $kV_{max}$. This low PDIV indicates somewhat poor insulation quality. To increase the PDIV, some options available include improving the manufacturing process to decrease internal defects and increase insulation quality, or increasing conductor spacing to reduce electric field strength.

Figure 8:
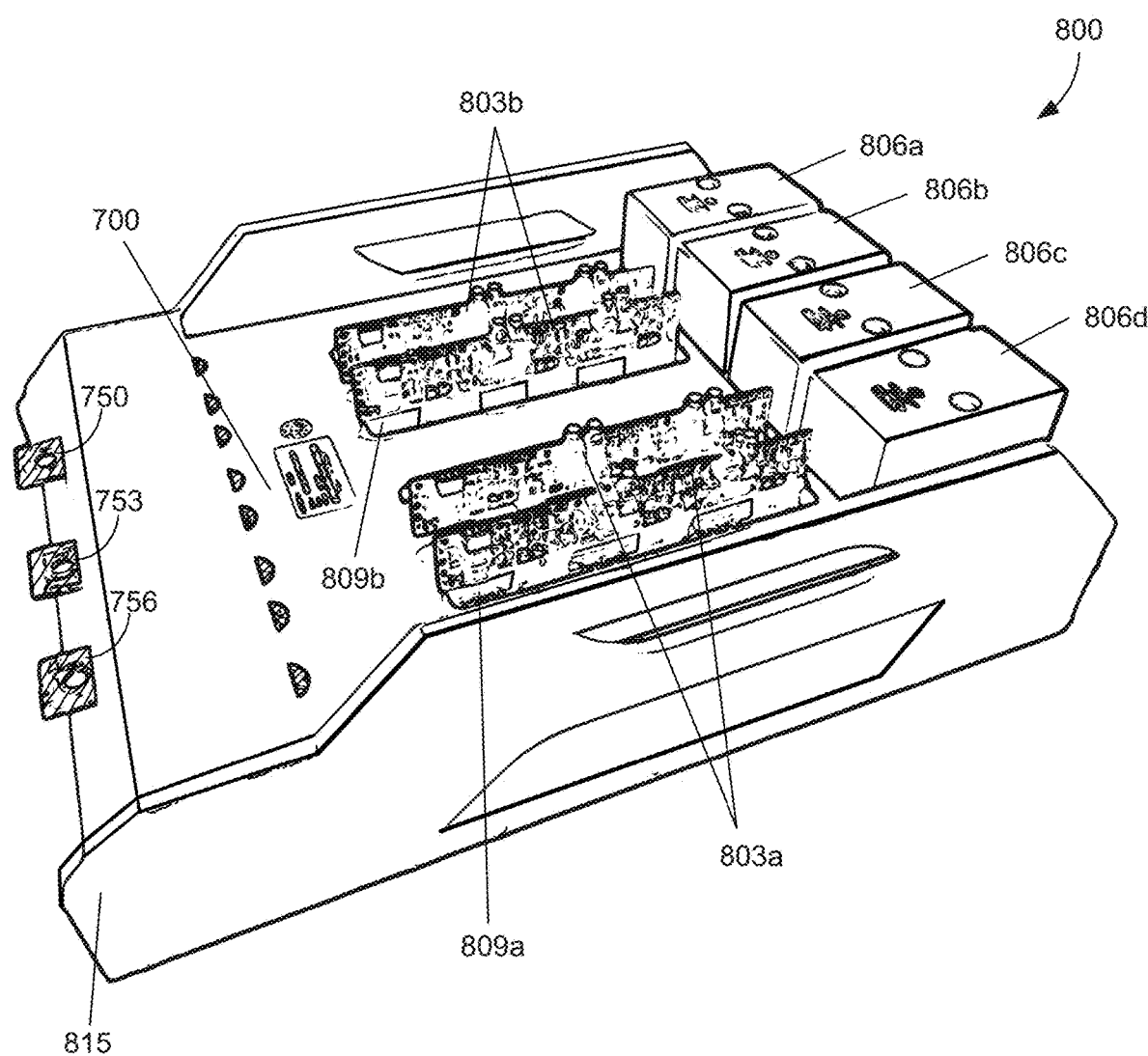
FIG. 8 illustrates a power stage converter integrating the fabricated bus structure shown in FIG. 7, along with other components according to an embodiment of this disclosure.

FIG. 8 shows a power stage converter 800 for a power electronic building block, integrating the laminated planar bus structure 700 shown in FIG. 7 with various other components. The bus structure 700 is not fully visible in FIG. 8 as it is contained within a plastic enclosure 815. The power stage converter 800 includes a first set of smart gate drivers 803a and a second set of smart gate drivers 803b that connect directly to power modules 809a and 809b, respectively. The power modules 8091a and 809b are not readily visible in this figure as the power modules 809a and 809b are mounted below the bus structure 700. A smart gate driver is the critical interface between power semiconductor devices and control signals, which serves to provide galvanic isolation and to supply driving current while maintaining signal integrity under a high-noise environment. In addition, smart gate drivers can provide a quick, reliable, and configurable protection, as well as advanced switch-current signal sensing and data processing for control purposes, which define a "smart" gate driver. The power modules 809a and 809b may include switching transistors such as SiC MOSFETs, Si MOSFETs, and Si IGBTs.

The power stage converter 800 also includes a plurality of decoupling capacitors 806a-806d, which connect to the positive conductive layer 712 through the circular apertures 733i-733p on the bus structure 700. Although not visible in FIG. 8, a plurality of decoupling capacitors may connect to the positive conductive layer 712 of the bus structure 700 through the circular apertures 733a-733h from under the dielectric layer 727 of the bus structure 700. The power stage converter 800 may also be configured to run in a H-bridge or a half-bridge configuration. The design of the bus structure 700 with the two ground layers 706 and 724 stacked as outer layers compared to the positive conductive layer 712 and the negative conductive layer 718 allows sensitive electronics, such as the smart gate drivers 803a and 803b, to be placed much closer to the bus structure 700 while reducing EMI and parasitic inductance.

Figure 9:
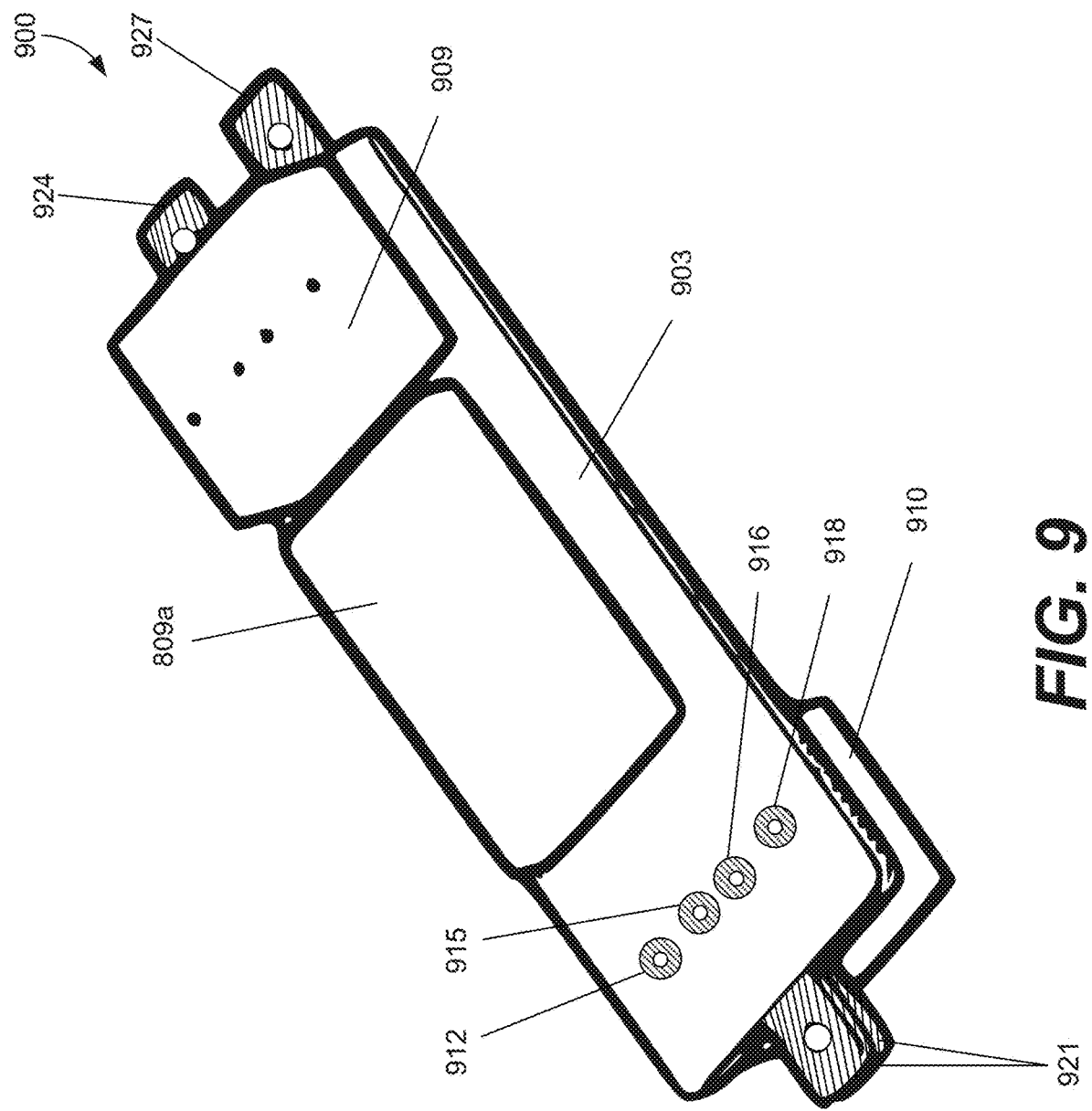
FIG. 9 illustrates a half-bridge power bus incorporating a bus bar structure and a single power module.

FIG. 9 shows a power bus converter 900 that is scaled from the power stage converter 800 according to various embodiments. In one embodiment, the power bus converter 900 may be configured to run in a half-bridge configuration according to various embodiment of the present disclosure. The power bus converter 900 includes a planar laminated bus structure 903, which can effectively deliver power to connected components while minimizing EMI and parasitic inductance. The laminated bus structure 903 may include at least four conductive layers, with two outer ground layers similar to the bus structure 700. Thus, the layer structure of the bus structure 700 shown in FIG. 7 may be implemented in the laminated bus structure 903. Dielectric layers are also stacked as external layers of the bus structure 903, over and under the top and bottom ground layers, as shown in FIG.

7A, for protection from the environment and additional electric field control strategies. The power bus converter 900 also includes a single power module 809a mounted on a top surface of the laminated bus structure 903. Also included in the power bus converter 900 are two parallel sets of series decoupling capacitors 909 and 910 that are mounted on the top surface of the bus structure 903 and on a bottom surface of the bus structure 903, respectively. In some embodiments, these decoupling capacitors may provide about 0.82 µF.

The power bus converter 900 also includes circular apertures 912, 915, 916, and 918 that have exposed conductors. The circular aperture 912 may have a portion of a negative conductive layer exposed, while the circular apertures 915 and 916 may have a conductive ground layer exposed. Additionally, the circular aperture 918 may have a positive conductive layer exposed. The power bus converter 900 includes straight bus terminals 921, 924, and 927, which are exposed conductors of the ground layers of the bus structure 903, the positive conductive layer, and the negative conductive layer, respectively. In some embodiments, the power bus converter 900 may include bent bus terminals or exclude bus terminals.

The power loop for the power bus converter 900 can be seen as power entering the positive conductive layer or plane of the power bus converter 900 from a source or power supply, traveling through an upper switch of the power module 809a to a switching node, and returning through a second switch of the power module 809a and back through the negative conductive layer of the power bus converter 900.

Bus terminals, such as the bus terminals 921, 924, and 927, have been shown to play a dominant role in loop inductance. Overlapping terminals as much as possible can provide the largest reduction in inductance due to field cancellations, but such design may not always be feasible. An alternative design would be to widen terminals while paying attention to any clearance and creepage requirements. In the following paragraphs, design considerations of bus structures relating to reducing parasitic inductance and controlling electric fields will be discussed.

Placing capacitors near power modules have been shown to shorten the power loop and significantly reduce parasitic inductance. Smaller decoupling capacitors can be used to provide a fast source for switching energy. Load current is supplied by other power sources or larger DC link capacitors that may be located relatively far away. Although the loop of these sources may be large, they primarily supply load current while there is no $$\frac{di}{dt},$$

making the effect of their inductance negligible. In FIG. 8, the plurality of decoupling capacitors 806a-806d and power modules 809a and 809b are connected directly to the bus structure 700, which results in terminal inductance being negligible.

Figure 10:
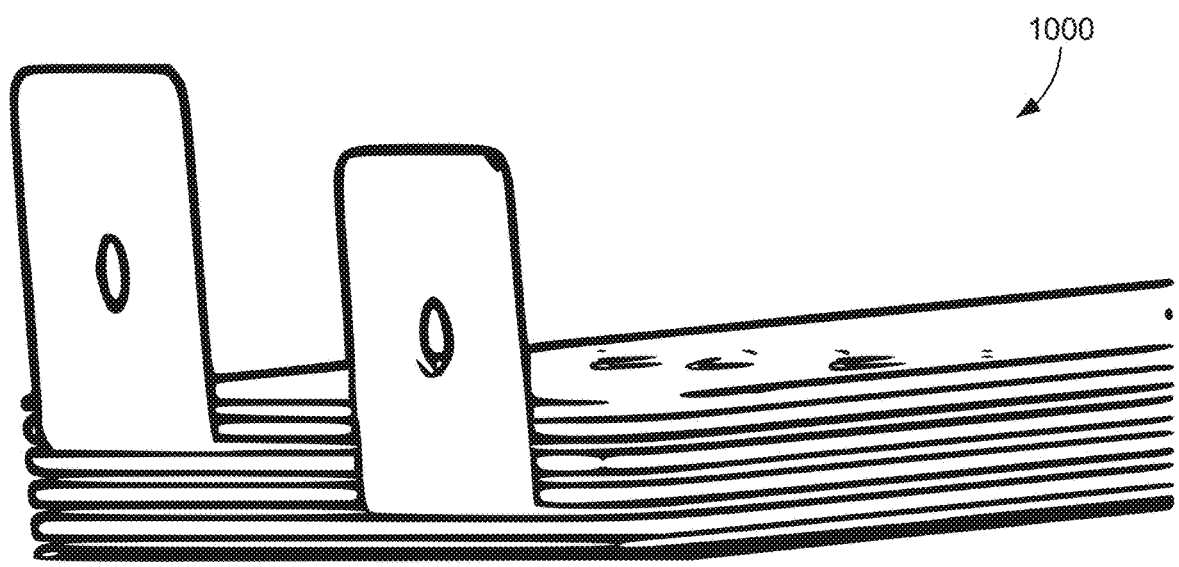
FIG. 10 illustrates a bus structure with bus terminals bent 90 degrees according to an embodiment of this disclosure.
Figure 11:
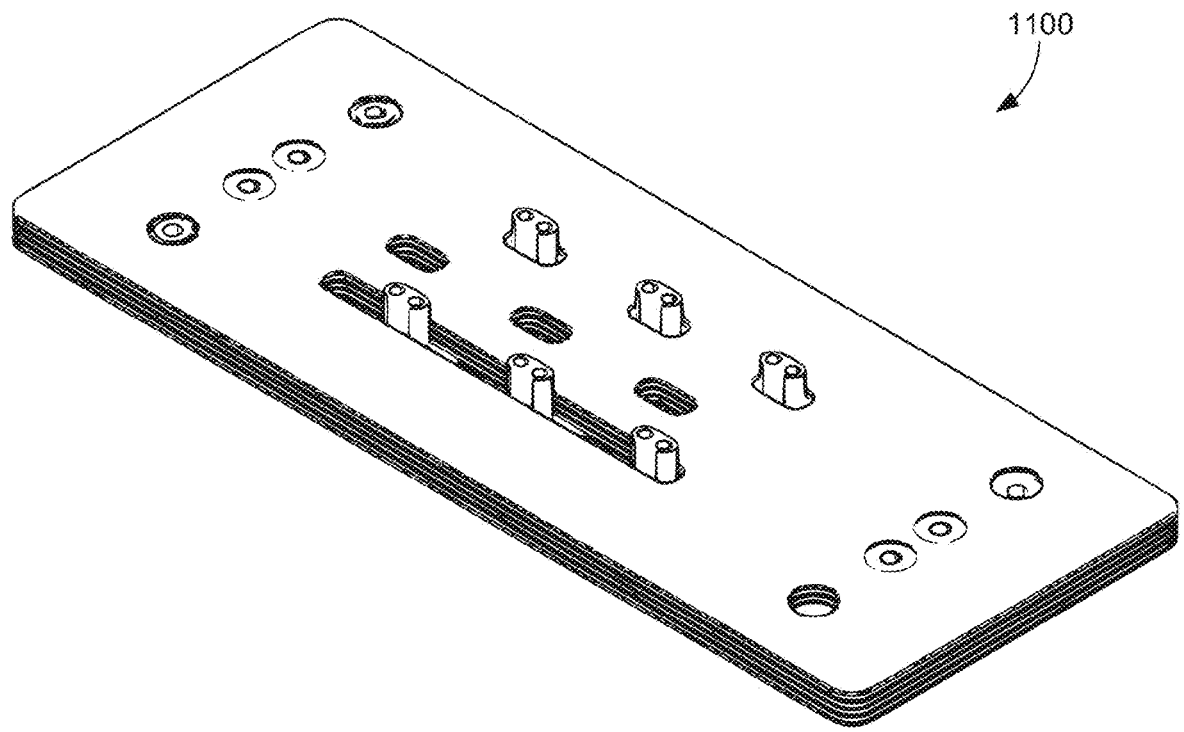
FIG. 11 shows a bus structure without bus terminals according to an embodiment of this disclosure.

FIG. 10 shows a portion of a bus structure 1000 with bus terminals bent 90° while FIG. 11 shows a bus structure 1100 without bus terminals. Both bus structures 1000 and 1100 may be configured to run in a half-bridge configuration. To demonstrate the significance bus terminals play in affecting equivalent bus inductance, inductance was extracted from the bus structures 900, 1000, and 1100—corresponding to the bus structures with straight bus terminals, 90° bent terminals, and without terminals, respectively. The results are summarized in Table I.

TABLE I

| Equivalent Bus Inductance | |
| --- | --- |
| Half-bridge Configuration | $L_{eq}$ (nH) |
| Straight terminal | 60.39 |
| 90° terminal | 53.89 |
| No terminal | 36.19 |

In terms of strictly comparing bus inductance, the configuration without bus terminals represents a case equivalent to when decoupling capacitors are used. Without bus terminals, as in bus structure 1100, inductance was measured from decoupling capacitor terminals at a positive conductive layer and negative conductive layer of the bus structure 1100. Table I summarizes the equivalent bus inductance results, which shows that bus structure 1100 without bus terminals provides a lower inductance of 36.19 nH.

Based on equation (2) listed below, it is apparent that reducing spacing between conductors will also lower loop inductance.

$$L \approx \mu \frac{h}{w} \qquad (2)$$

From an inductance perspective, reducing the spacing between planes is desirable as it shortens the communication loop. However, additional considerations must be taken into account when designing thickness to ensure lifetime and reliability. Proper insulation design is essential to enabling the possibility of a medium voltage planar bus while ensuring reliable and desirable circuit operation. Insulation design becomes more complex as differential voltages between two planes increase. Average electric field strength $E_{av}$ can be calculated using equation (3) below where V represents the differential voltage between two conductors and d represents the distance between them.

$$E_{av} = \frac{V}{d} \qquad (3)$$

Solving for d and comparing with a material's datasheet, hand calculations can be used to determine the absolute minimum insulation thickness requirement. The final insulation thickness should not be determined using $E_{av}$, as various factors may create intensified non-homogeneous fields.

In addition, solid dielectric breakdown strength is not linear with increasing thickness. For example, if it were desired to increase the PDIV from 4 kV to 8 kV, the minimum insulation thickness would need to be more than doubled. Various theories have been proposed as to why this nonlinearity in breakdown strength vs. thickness exists, but it is still not fully understood. However, experimental results have shown the existence of this relationship. Experimental results show that the breakdown strength of a polyimide film with varying thickness decreased on a double logarithmic scale. A safety margin should be added to account for intensified fields and aging insulation. Bus manufacturers who specialize in bus structures with stacked planar conductive layers have suggested a conductor spacing of at least 10 mm to ensure a PDIV of 4 kV.

It is advantageous to avoid stacking multiple insulation layers to limit the number of interfaces when a bonding epoxy between layers is used as voids may be introduced in the epoxy interface. These voids are often trapped air and experience breakdown at a much lower voltage than the surrounding insulators. Viewing this problem as a capacitive voltage divider, the void would experience a higher field causing a higher voltage. Local breakdown occurring in these voids, also known as partial discharge (PD), may not immediately break down the main insulator. However, it is well known that PD can dramatically reduce lifetime of the insulation, depending on the discharge magnitude.

Solid insulators typically have a high dielectric strength. For example, Kapton HN is listed as 303 kV/mm for a film 25 μm thick. Equation (3) is valid in parallel plane regions when electric field is homogeneous. Near edges, however, fringe fields may exist with increased strength. The interface between a conductor and two dielectrics is commonly known as a triple point. Because electric fields are forced to meet boundary conditions, extremely high electric fields may exist in this region. Enhanced electric fields at microprotrusions and the triple point lower the electrical strength of insulators.

$$E_p = \varepsilon_r \beta E_{av} \quad (4)$$

$$\beta = 2 + \frac{h}{r} \quad (5)$$

These electric fields are enhanced to equation (4) by an intensification factor (5) when the interfaces are not perfect with all matching dielectric constants. The radius at the interface is represented by r, the height is represented by h, and $\varepsilon_r$ is the relative dielectric constant of the material. FEA software such as ANSYS Maxwell and COMSOL Multiphysics can provide a more accurate model of electric field distribution in areas of interest. For planar bus structures such as the bus structures 700, 903, 1000, and 1100, areas of interest include regions throughout the bus structures where external connectors are present and around surfaces exposed to air.

Implementation of Three Ground Layers for Bus Structures

Figure 12:
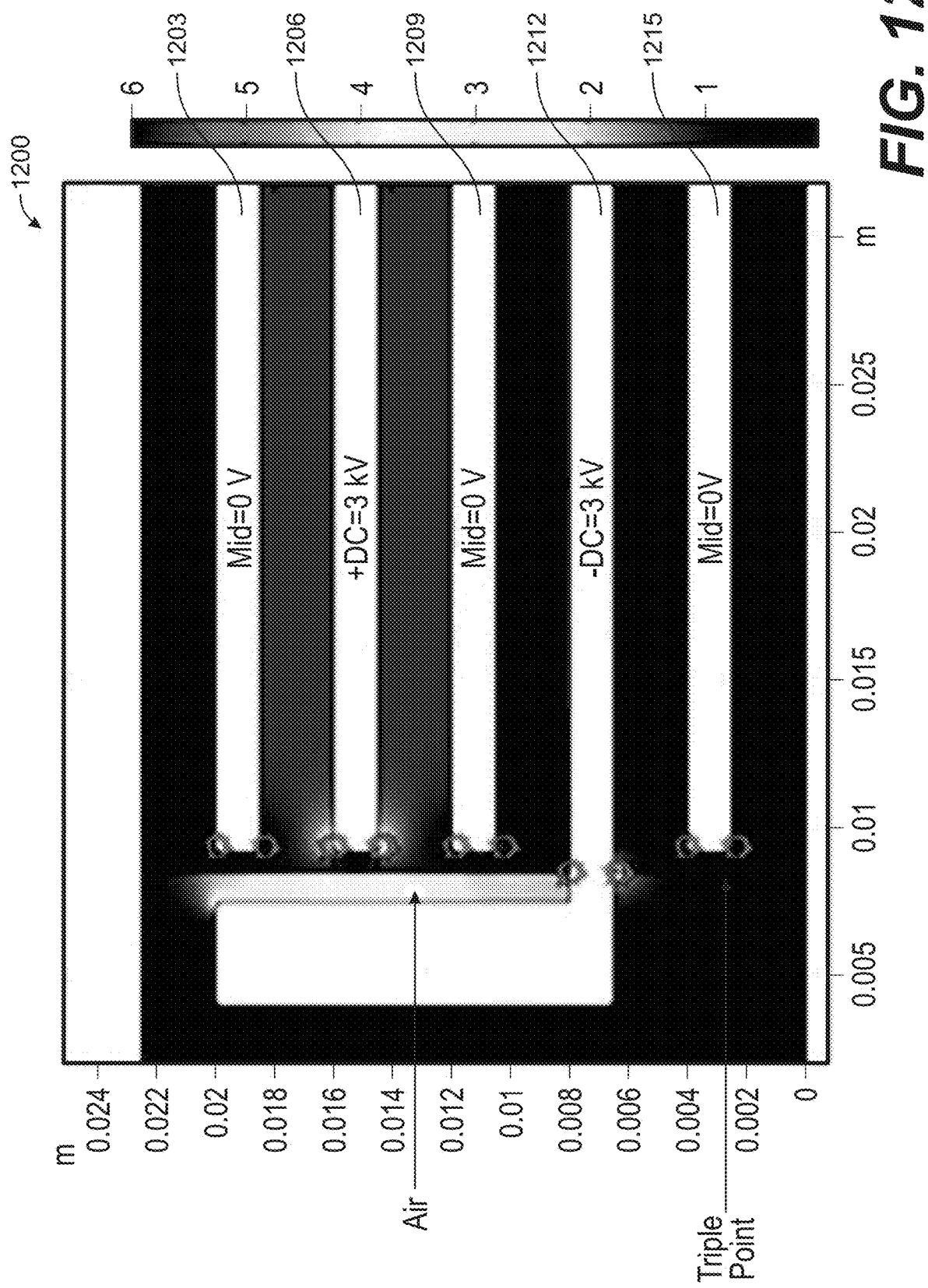
FIG. 12 is a cross-sectional finite element analysis illustration of a bus structure with three ground layers according to an embodiment of this disclosure.

FIG. 12 shows a FEA simulation result of a bus structure 1200 with five conductive layers, including three conductive ground layers—positive conductive layer 1206, negative conductive layer 1212, MID or ground layer 1209 separating the positive 1206 and the negative conductive layers 1212, a ground layer 1203 stacked over the positive conductive layer 1206, and a ground layer 1215 stacked under the negative conductive layer 1212. An additional ground layer 1209 between the positive 1206 and the negative 1212 conductive layers can balance differential voltage so that maximum voltage between any two adjacent layers is only ½$V_{DC}$. Since the differential voltage can be reduced by 50%, insulation thickness can also be reduced by at least 50% considering the nonlinear relationship between breakdown strength and insulation thickness discussed previously. The additional ground layer 1209 between the positive and the negative conductive layers, as compared to the bus structures 700 and 900, which had two ground layers, can have the effect of decreasing peak electric field strength at various triple points marked in FIG. 12.

To verify the effect of adding the additional ground layer 1209 between the positive 1206 and the negative 1212 conductive layers, electric field was simulated in a FEA simulation using the bus structure 700 shown in FIG. 7 with two ground layers, at a circular apertures 733a-733h connected to the negative conductive layer 718. Insulation thickness for the insulation layer 715 between the positive conductive layer 712 and the negative conductive layer 718 was swept from 60 μm to 20 mm in increments of 20 μm. Thickness of the insulation layers 709 and 721—layers between the upper ground layer 706 and positive conductive layer 712, and bottom ground layer 724 and negative conductive layer 718, respectively—were swept from 30 μm to 10 mm in 10 μm increments since insulation thickness between these layers were half the thickness compared to the insulation thickness for the insulation layer 715 (refer to FIG. 3).

Electric field strength was also analyzed for the bus structure 1200 using a similar method to that discussed above. Insulation layers between all conductive layers were swept from 10 μm to 10 mm providing a basis for comparing how electric field strength varied with increasing insulation thickness for the bus structure 700 with two ground layers and the bus structure 1200 with three ground layers. To ensure proper comparison, a fixed mesh of 5 μm was used for both cases. This ensured that as the geometries changed with each instance, an adaptive mesh would not provide skewed results potentially favoring one over the other.

Figure 13:
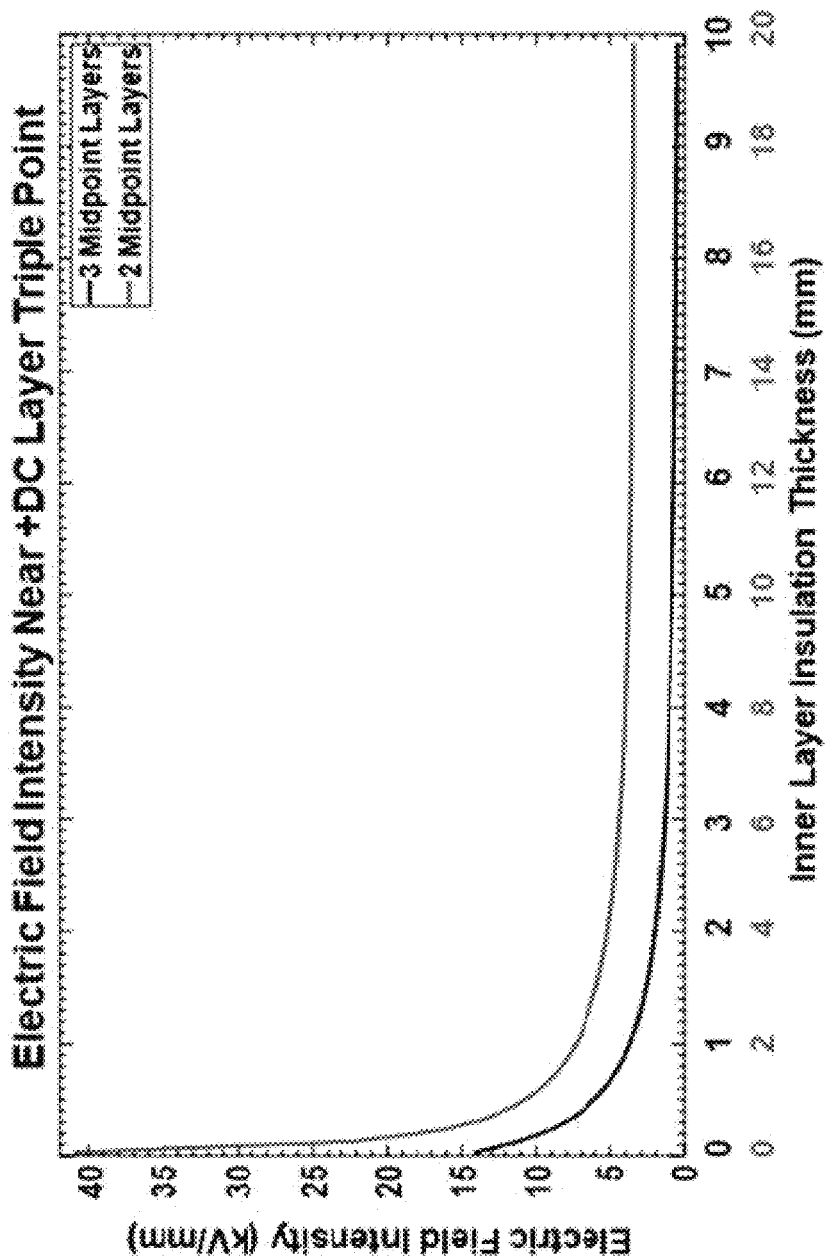
FIG. 13 is a graphical illustration showing a comparison of electrical field strength verses inner layer insulation thickness for a bus structure with two conductive ground layers and a bus structure with three conductive ground layers.

FIG. 13 shows the results of the sweep conducted for the bus structure 700 with two ground layers and the bus structure 1200 with three ground layers. Electric field was measured 30 μm from a triple point near the positive conductive layer 712 and at a triple point near the positive conductive layer 1206. It should be noted that electric field strength has been scaled to fit on the same plot for comparison purposes. Electric field strength for an instance where insulation thicknesses was 0.86 mm for insulation layer 715 of the bus structure 700, and 0.43 mm for an insulation layer of the bus structure 1200, was measured to be 11.38 kV/mm for the bus structure 700 and 7.92 kV/mm for the bus structure 1200. By adding an extra ground or MID layer 1209 to the bus structure 1200, electric field strength decreased in the region of interest by about 30%. These insulation thicknesses were chosen for comparison because they can span the thickness of what would be used for a traditional laminated bus structure utilizing thick copper plates, as well as bus structures constructed from a printed circuit board (PCB).

The design of traditional laminated bus structures, which can utilize thick copper plates, have been discussed thus far. However, meaningful data that can be used for research and design purposes is limited, even for manufacturers. Multiple vendors have recommended sizing insulation layers to more than 400% of the insulation thicknesses previously used. This recommendation for increase in spacing is for the purpose of avoiding high electric fields in very thin low flow epoxy adhesive, which is on the order of 25 μm thick. Maximum field strength allowable in the epoxy adhesive is unknown or could not be obtained from manufacturers. Since insulators typically extend past conductors, air gaps can be created. Manufacturers typically use a process known as "epoxy edge fill," which fills these gaps to prevent breakdown at the air/conductor/insulation interface. This process is commonly done by hand, which may leave additional undesirable voids.

With the overall purpose of providing power delivery between components, multiple forms of power bus structures may be used. Disclosed in this next section is the design process of a printed circuit board (PCB) bus structure and its related embodiments. A PCB planar bus structure may offer lower inductance compared to traditional laminated bus structures because of closer layer proximity. Additional benefits of a PCB planar bus structure over other forms may include selectability of materials to achieve desired performance requirements, while also maintaining high insulation quality. For example, prepreg and core can be selected for the PCB so internal voids may be reduced by avoiding high glass content and low flow options. However, it is important to note that the design process and optimization steps for a PCB based bus structure disclosed herein may be applicable to traditional laminated bus structures utilizing thicker copper plates and dielectrics as well, and vice versa.

Printed Circuit Board Planar Bus Structure Design

The design and simulation results presented herein can consider voltages of $+V_{DC}=3.5$ kV, $-V_{DC}=-3.5$ kV, and $V_{MID}=0$ V, as these values are assumed to represent a DC bus structure operating at a nominal differential voltage of 6 kV, aside from operational voltage deviation, peak ripple, and peak voltage overshoot due to transients. Multiple design parameters discussed in this section will be varied to meet two larger design constraints: achieving an acceptable field strength along a surface of a PCB bus structure in air and achieving an acceptable field strength inside of the internal dielectric, or prepreg and core, of the PCB bus structure.

The breakdown strength of dry air is considered to be approximately 3.3 kV/mm. To prevent surface discharge in a variety of operating conditions, the maximum target electric field in air was set to be 60% of the breakdown strength in dry air, or 2.0 kV/mm. PCB designers have great flexibility when choosing what prepreg and core to use. A low-profile PCB construction is possible, even with high fields, by using a high dielectric strength prepreg and core. For example, Arlon 85 HP, a polyimide, can be chosen for its electrical strength of 66.9 kV/mm (1700 kV/mil). The electric ratings provided on manufacturer datasheets are for new insulation and do not consider aging. New and aged electric strength for polyimide samples is provided in "*High voltage printed circuit design & manufacturing notebook*," by R. Tarzwell and K. Bahl, (Sierra Proto Express, design guide, Nov. 4, 2004), which is hereby incorporated by reference in its entirety.

Values from "*High voltage printed circuit design & manufacturing notebook*" were used to obtain a general derating factor $\alpha$ for equation 6 below:

$$\alpha = \frac{E_{aged}}{E_{new}}. \tag{6}$$

This derating value was then used to determine a range of derated dielectric values for Arlon 85 HP calculated with equation 7 below:

$$E_{aged} = \alpha E_{new}. \tag{7}$$

The range of $\alpha$ was found to be 0.55 to 0.77 leading to the assumption that the derated value of Arlon 85 HP should be somewhere between 23.75-33.25 kV/mm (935-1309 V/mil). Thus, the maximum electric field strength threshold inside the PCB dielectric (prepreg and core) was decided to be 25.4 kV/mm (1000 V/mil) for all simulations.

Values for electric field in air is described in units of kV/mm whereas electric field strength inside the dielectric of the PCB is given in V/mil for simplicity and also because PCB insulation parameters and board thickness are often referenced in the unit mils. Units can easily be converted using the conversion factor 1 mil equals 0.0254 mm or 1 mm is approximately 39.37 mil.

Figure 14:
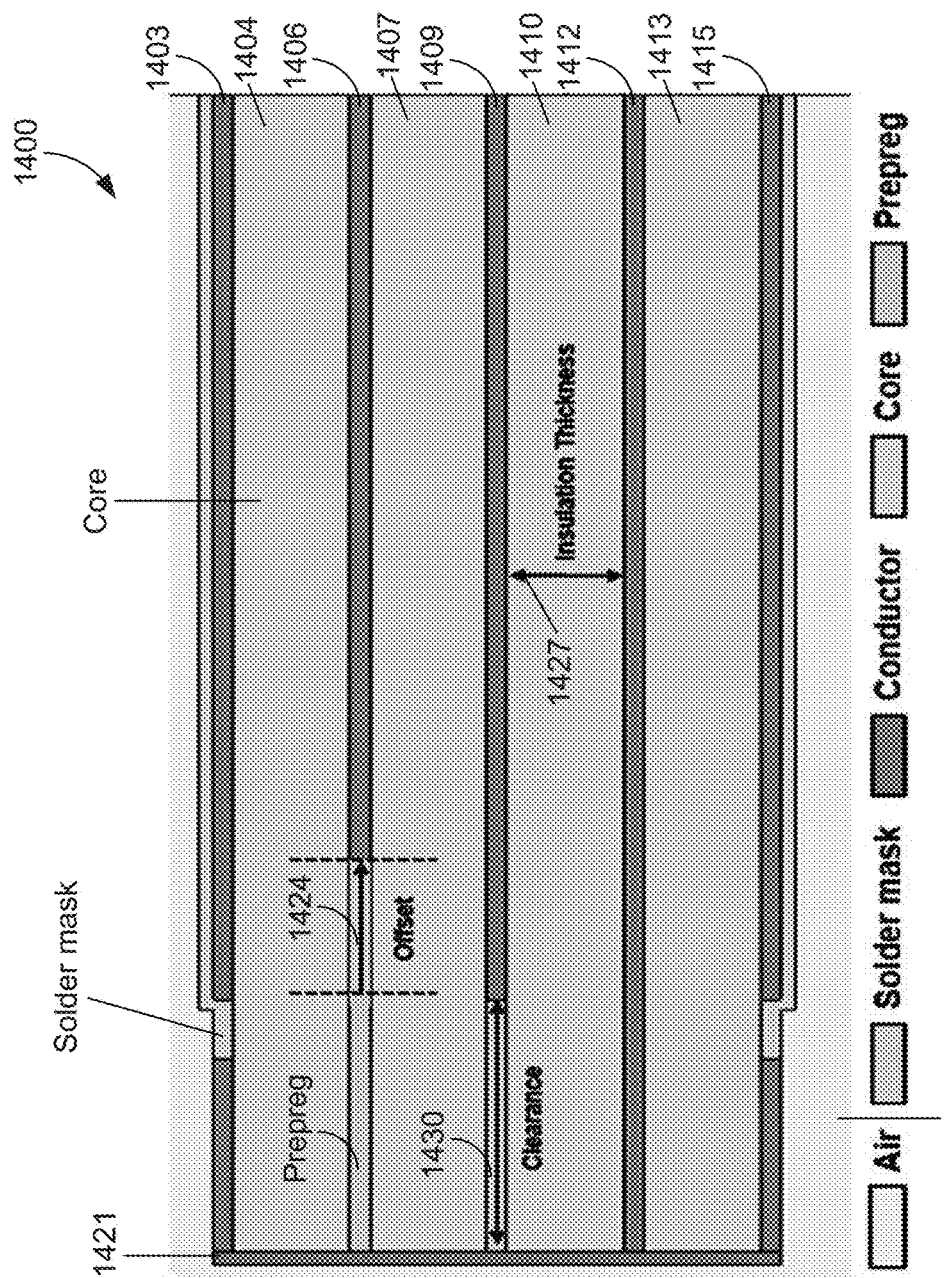
FIG. 14 illustrates a cross sectional view of a bus structure with five conductive layers including three conductive ground layers according to an embodiment of the present disclosure.

FIG. 14 shows a cross sectional view of a PCB planar bus structure 1400 with five conductive layers including three MID or ground layers according to various embodiments of the present disclosure. Each conductive layer may include 2 oz. copper (Cu). The five conductive layers of the PCB planar bus 1400 includes an upper ground layer 1403, a positive conductive layer 1406, a middle or MID ground layer 1409, a negative conductive layer 1412, and a bottom ground layer 1415. Traces of each conductor can run across its respective layers. Additionally, PCB planar bus 1400 includes a via 1421 connecting to the negative conductive layer 1412.

When creating a PCB bus structure, design rules are commonly set to provide a specific clearance between traces of a different potential and a power plane. In various embodiments, optimized custom clearances can be implemented for the positive conductive layer 1406 and the ground layers 1403, 1409, and 1415 to further decrease electric field strength and improve insulation design, instead of setting all clearance requirements the same. For example, the positive conductor offset 1424 can be gradually increased as clearance for the positive conductive layer 1406, measured from the plated via 1421, comes closer to matching clearance 1430 set by the MID ground layer 1409, thus known also as a relative offset. Eventually, the positive conductor offset 1424 becomes positive as the clearance for the positive conductive layer 1406 exceeds the clearance 1430 of the MID ground layer 1409. In contrast, a negative offset would be defined as the positive conductive layer 1406 being closer to the plated via 1421 than the horizontal distance the MID ground layer 1409 is from the plated via 1421.

Figure 15:
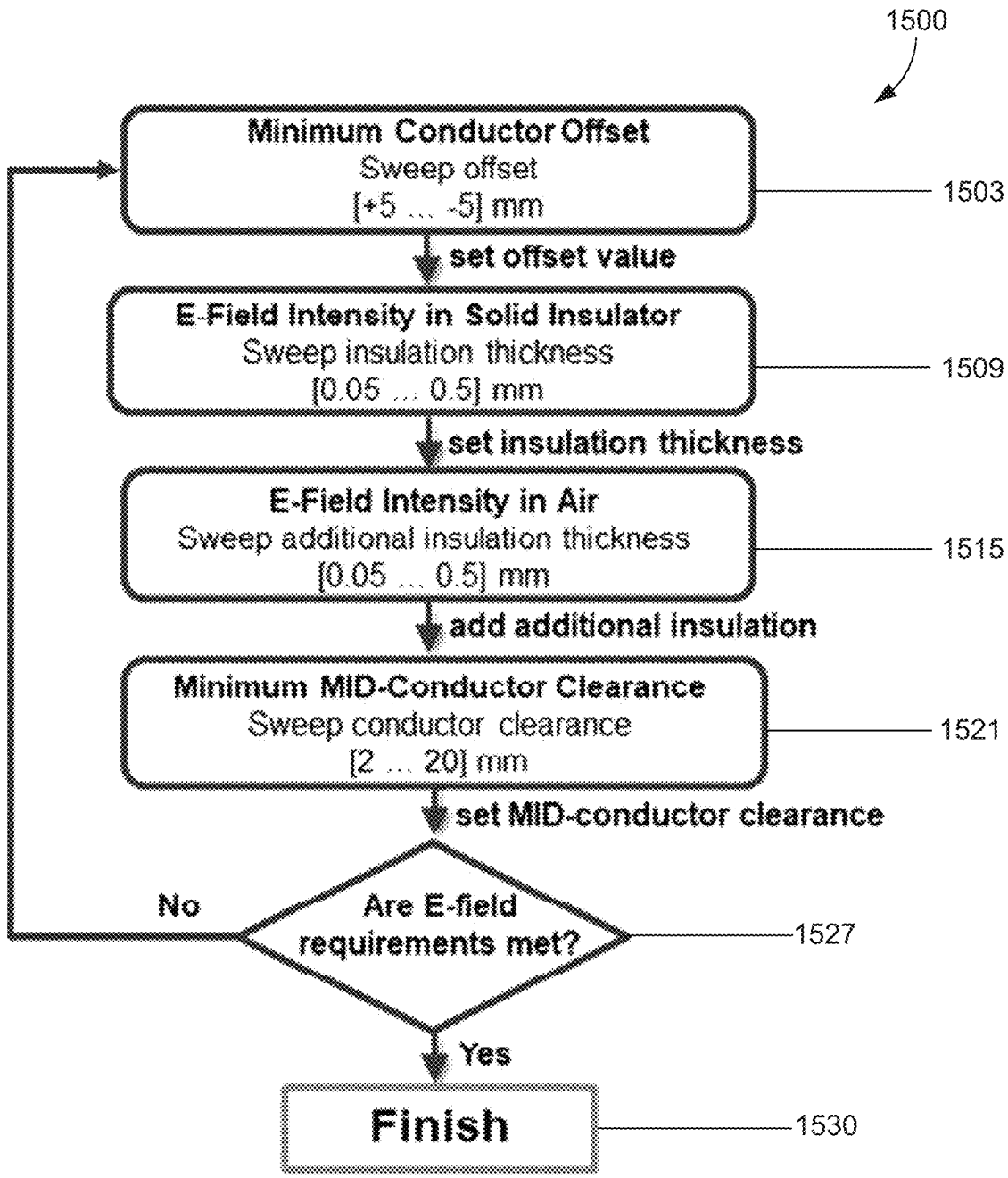
FIG. 15 illustrates a flow chart detailing steps on optimizing electric field strength for a bus structure with five conductive layers including three conductive ground layers.

FIG. 15 shows a flowchart 1500 for optimizing a PCB bus structure's electric field, which are applicable to the embodiments of PCB bus structure 1400. The steps of flowchart 1500 are discussed in detail with respect to the PCB planar bus 1400 but can be extended to other design parameters as well. In step 1503, the positive conductor offset 1424, as shown in FIG. 14 to be measured from one edge of the positive conductive layer 1406 to the MID ground layer 1409, can be swept from [+5 . . . −5] mm in 0.1 mm increments to determine if electric field strength can be reduced from varying this parameter. In one embodiment, the positive conductor offset 1424 value of 1 mm was found to reduce electric field strength by approximately 13% when compared to the peak electric field strength with no offset. The measurements may be taken at top and bottom triple points near the positive conductor 1407. Additionally, increasing the positive conductor offset 1424 beyond 1 mm did not provide an additional decrease in electric field strength. This reduction in peak electric field strength due to the 1 mm offset can be seen in FIG. 16. Examples of triple point locations are shown in FIG. 12, as discussed previously.

Figure 16:
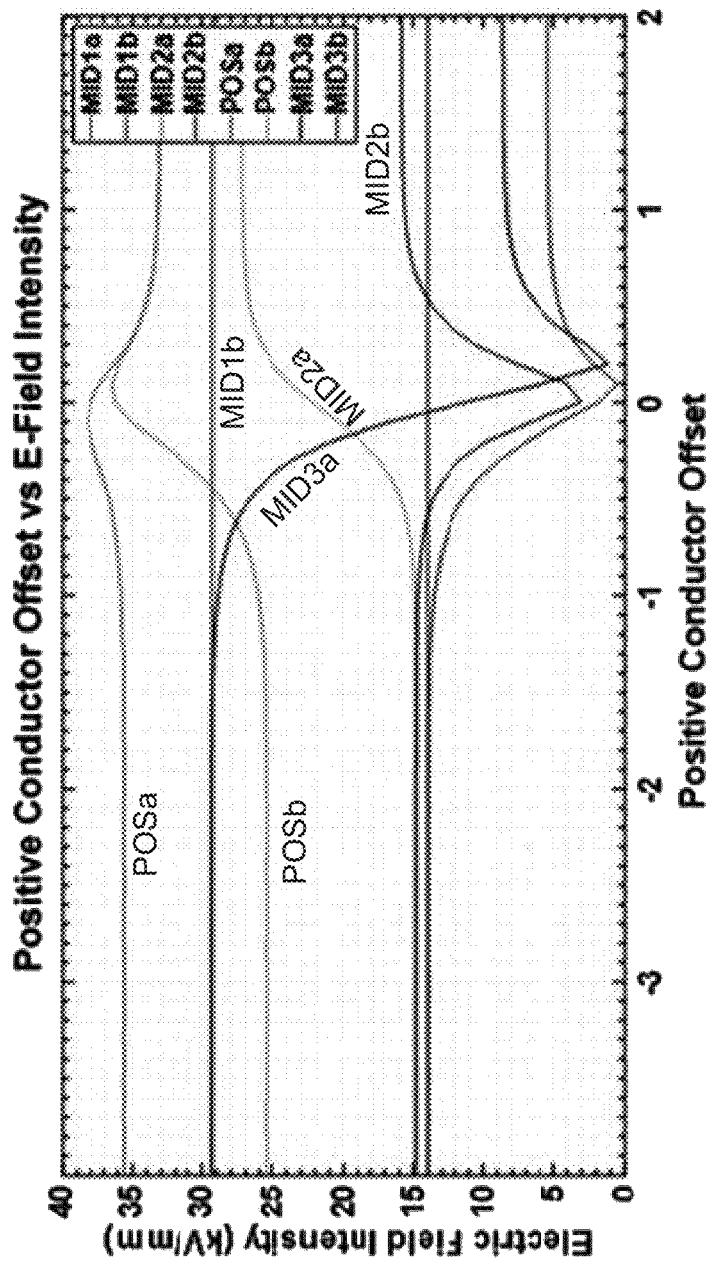
FIG. 16 is a graphical illustration of electric field strength measured near each triple point illustrated in FIG. 12 as a function of positive conductor offset.

FIG. 16 shows a plot of electric field strength measured near the top and bottom triple points for the positive conductive layer 1406, the upper ground layer 1403, the middle ground layer 1409, and the bottom ground layer 1415, as a function of the positive conductor offset 1424. The peak electric fields were at the top and the bottom triple points near the positive conductive layer 1406, labeled POSa and POSb, respectively, since the positive conductive layer 1406 has the highest voltage differential with respect to the negative conductive layer 1412. From this plot, the peak electric field strength decreases for POSa and POSb going from a 0 mm offset to the 1 mm offset by about 13%.

Next, in step 1509, conductor spacing is controlled by varying inner layer insulation thickness of each insulation layer 1404, 1407, 1410, and 1413 to achieve an acceptable electric field strength for those layers. Although an arbitrarily thick insulation thickness 1427 can be used, it is ideal to minimize this to an acceptable thickness to reduce inductance as previously discussed. As discussed previously, the maximum threshold electric field strength inside each insulation layer is 25.4 kV/mm (1000 V/mil). Using the 1 mm positive conductor offset 1424, the insulation thickness 1427, which is representative of insulation thickness for each insulation layer 1404, 1407, 1410, and 1413, is swept from [2 . . . 20] mil or [0.05 . . . 0.5] mm in 2 mil increments. 2 mil increments were chosen because that is one of the smallest common core and prepreg increments available from various manufacturers. In one embodiment, 1000 V/mil was reached with the insulation thickness 1427 of 16 mils. Increasing the thickness further may decrease the maximum field strength further but was not necessary in light of the previously defined design constraints.

Next, in step 1515, electric field intensity in air is checked to see if the 2.0 kV/mm target discussed previously, based on the breakdown strength of dry air, is reached. Using the 1 mm positive conductor offset 1424 and the insulation thickness 1427 of 16 mils, it was found that the 2 kV/mm design constraint for air was exceeded near the top and bottom surfaces of the PCB bus 1400 that were exposed to air. Three methods were analyzed to reduce field strength in air: 1) increase insulation thickness for each insulation layer between two conductive layers; 2) increase insulation thickness in insulation layers between the middle ground layer 1409 and the positive conductive layer 1406, and the middle ground layer 1409 and the negative conductive layer 1412; and 3) add an additional insulation layer between the upper ground layer 1403 and air, and an additional insulation layer between the bottom ground layer 1415 and air. It was found that method 3 added less height to the PCB bus 1400 than the other two methods. In one embodiment, implementing method 3 added approximately 20 mils to the top and bottom of the PCB planar bus 1400 for an increase in total thickness of 40 mils. Although it is commonly recommended to keep board layers in even number increments, it is possible to have an odd number of layers. However, a request may need to be made to a PCB manufacturer.

Next, in step 1521, minimum MID ground layer clearance 1430 is swept from [2 . . . 20] mm in 0.1 mm increments while keeping the positive conductor offset 1424 value of 1 mm. The MID ground layer clearance 1430 is generally varied with respect to plated via 1421. In one embodiment, the MID ground layer clearance 1430 value of approximately 5.9 mm was found to reduce maximum electric field in air to 2 kV/mm and 1000 V/mil in the insulation layers 1404, 1407, 1410 and 1413 of the PCB bus structure 1400. Finally, all parameters are checked again in step 1527 and iterated from the beginning if any conditions are not met. Final design parameters from the optimization process for the bus structure 1400 are shown in Table II below.

TABLE II

Final Design Parameters

| Parameter | Value |
| --- | --- |
| MID Conductor Clearance | 6 mm |
| Positive Conductor Offset | 1 mm |
| Insulator Thickness | 16 mil |
| Additional Core Thickness | 20 mil |

Figure 17:
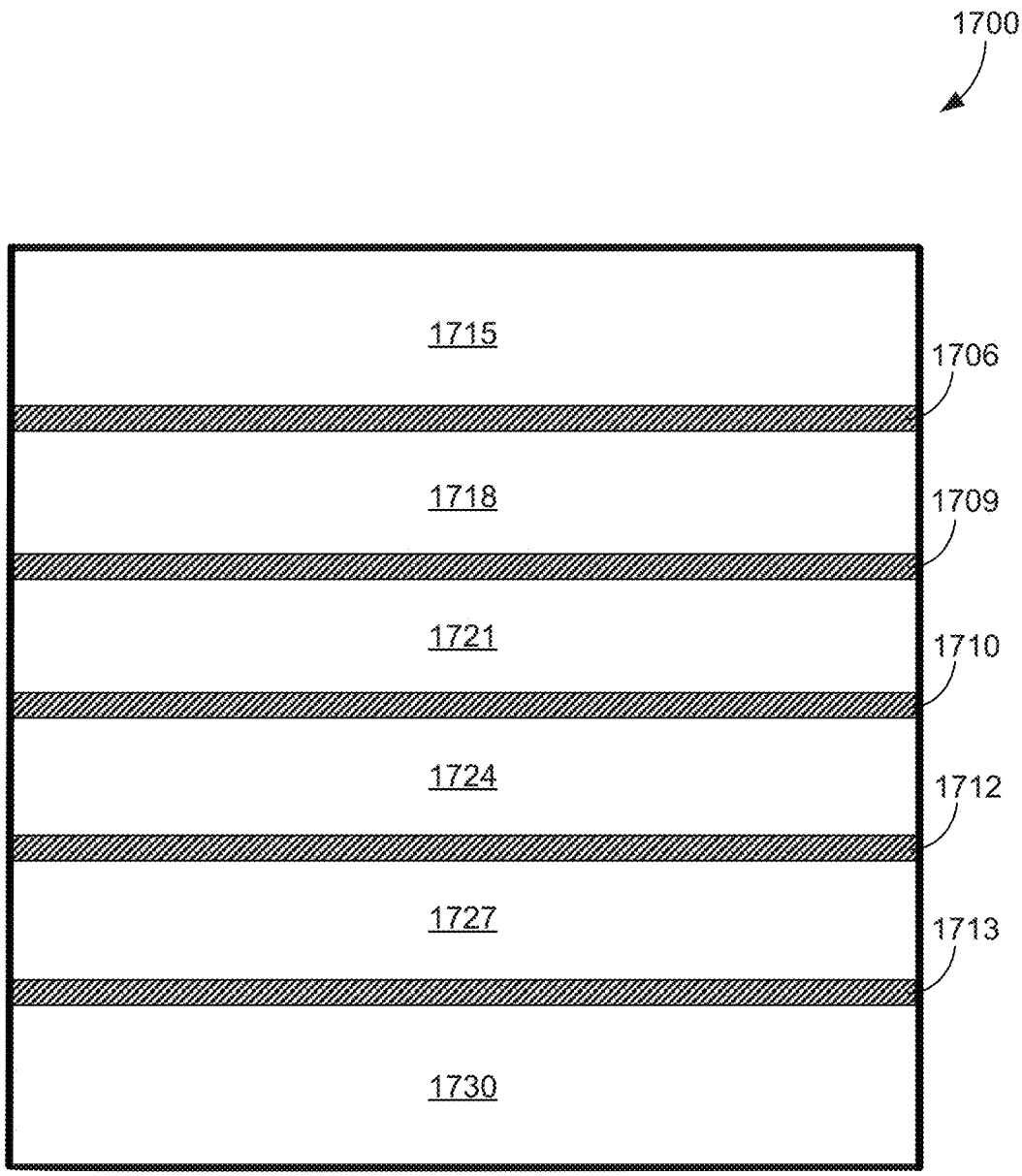
FIG. 17 illustrates a printed circuit board (PCB) bus structure, which includes five conductive layers according to various embodiments of the present disclosure.

FIG. 17 illustrates a PCB planar bus 1700, which incorporates two additional insulation layers 1715 and 1730 discussed in the optimization steps discussed from flowchart 1500. As shown, the 2 extra insulation layers, or core layers, 1715 and 1730 are stacked above upper ground layer 1706 and below bottom ground layer 1713, respectively. The PCB planar bus 1700 also includes a positive conductive layer 1709, a middle ground layer 1710, and a negative conductive layer 1712. It should be the noted that the number of conductive layers as shown in FIG. 17 is a minimum number of conductive layers. The ground layers 1706, 1710, and 1713 may serve as reference points for the additional conductive layers 1709 and 1712 in the PCB planar bus 1700. The positive conductive layer 1709 is positive with respect to the ground layers 1706, 1710, and 1713, and has a potential greater than the ground layers 1706, 1710, and 1713. The negative conductive layer 1712 is negative with respect to the ground layers 1706, 1710, and 1713, and has a potential less than the ground layers 1706, 1710, and 1713.

In some embodiments, the PCB planar bus 1700 may include more conductive layers. For example, the PCB planar bus 1700 may comprise three negative conductive layers 1712 and two middle ground layers 1710. In another example, the PCB planar bus 1700 may have two or three positive conductive layers 1709 in combination with the previous example. In a further example, the PCB planar bus 1700 may comprise low voltage conductive layers stacked as outer layers with respect to the upper ground layer 1706 and the bottom ground layer 1713. The low voltage conductive layers may be connected to a low voltage such as less than 100V and can be used to integrate other boards sitting above the PCB planar bus 1700 into the PCB planar bus 1700 itself. These additional layers can allow the PCB planar bus 1700 to have better current handling and thermal performance to process more power. The design of the PCB planar bus 1700 is not intended to be limited by the number of conductive layers. The PCB planar bus 1700 also includes insulation layers 1718, 1721, 1724, and 1727, which separate the plurality of conductive layers 1706, 1709, 1710, 1712, 1713.

The PCB planar bus 1700 may be implemented with the final design parameters listed from Table II. Therefore, the insulation layers 1715 and 1730 may have thicknesses of 20 mils while the insulation layers 1718, 1721, 1724, and 1727 may have thicknesses of 16 mils. The conductive layers 1706, 1709, 1710, 1712, and 1713 may have thicknesses of 2.8 mils, which is the thickness of 2 oz. of copper (Cu). Therefore, the total thickness of the PCB bus 1700 may be approximately 3 mm. The total thickness of 3 mm is a marked decrease from the total thickness of the bus structure 700, which may be approximately 47 mm. Parasitic inductance may measure approximately 8.88 nH. Final dimensions of PCB planar bus 1700 may measure 405 mm×272 mm. It is important to note that the structure and design of the PCB planar bus 1700 as mentioned in the preceding paragraphs may be implemented in a planar bus structure not constructed as a PCB.

Additionally, the PCB bus 1700 may have a positive conductor offset of 1 mm and a middle ground conductor clearance of 6 mm. However, depending on the insulating material used and/or desired design constraints, insulation thickness, conductor thickness, clearance of the ground layers, and positive conductor offset values may deviate.

Figure 18:
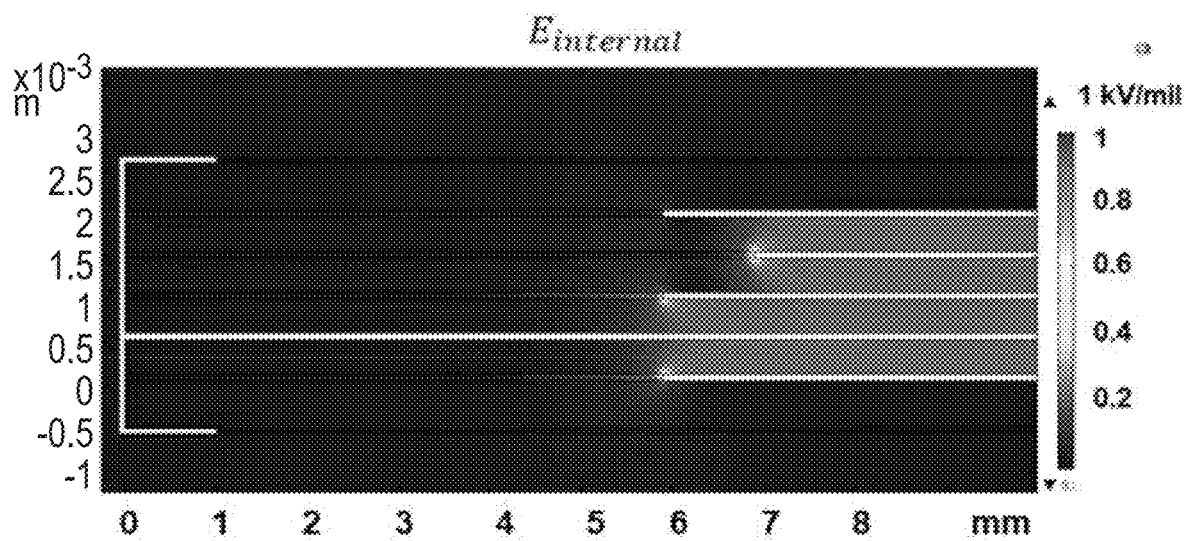
FIG. 18 shows a simulation result of the PCB bus structure shown in FIG. 17 indicating that electric field requirements are met inside the PCB bus structure.

FIG. 18 shows a simulation result of the PCB planar bus 1700 with the final design parameters from Table II implemented. FIG. 18 indicates that electric field constraints are met inside the PCB planar bus in the insulation layers. The simulation results show that the electric field in the insulation layers 1715, 1718, 1721, 1724, 1727, and 1730 is around 0.2 kV/mil, far below the design constraint of 1 kV/mil.

Figure 19:
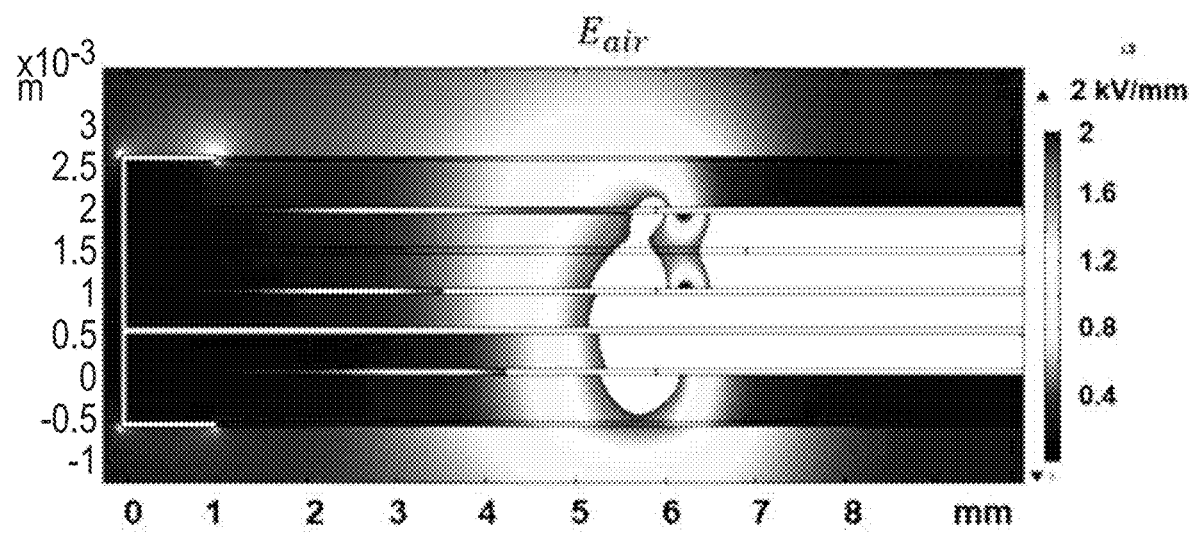
FIG. 19 shows a simulation result of the PCB bus structure shown in FIG. 17 indicating that electric field requirements are met in air.

FIG. 19 shows a simulation result of the PCB planar bus 1700 indicating that electric field constraints are met in air. The simulation results show that the maximum electric field in air near the top and bottom surfaces of the PCB planar bus 1700 is below the design constraint of 2 kV/mm. Areas in white indicate that the value is greater than 2 kV/mm and thus, is not plotted.

Figure 20:
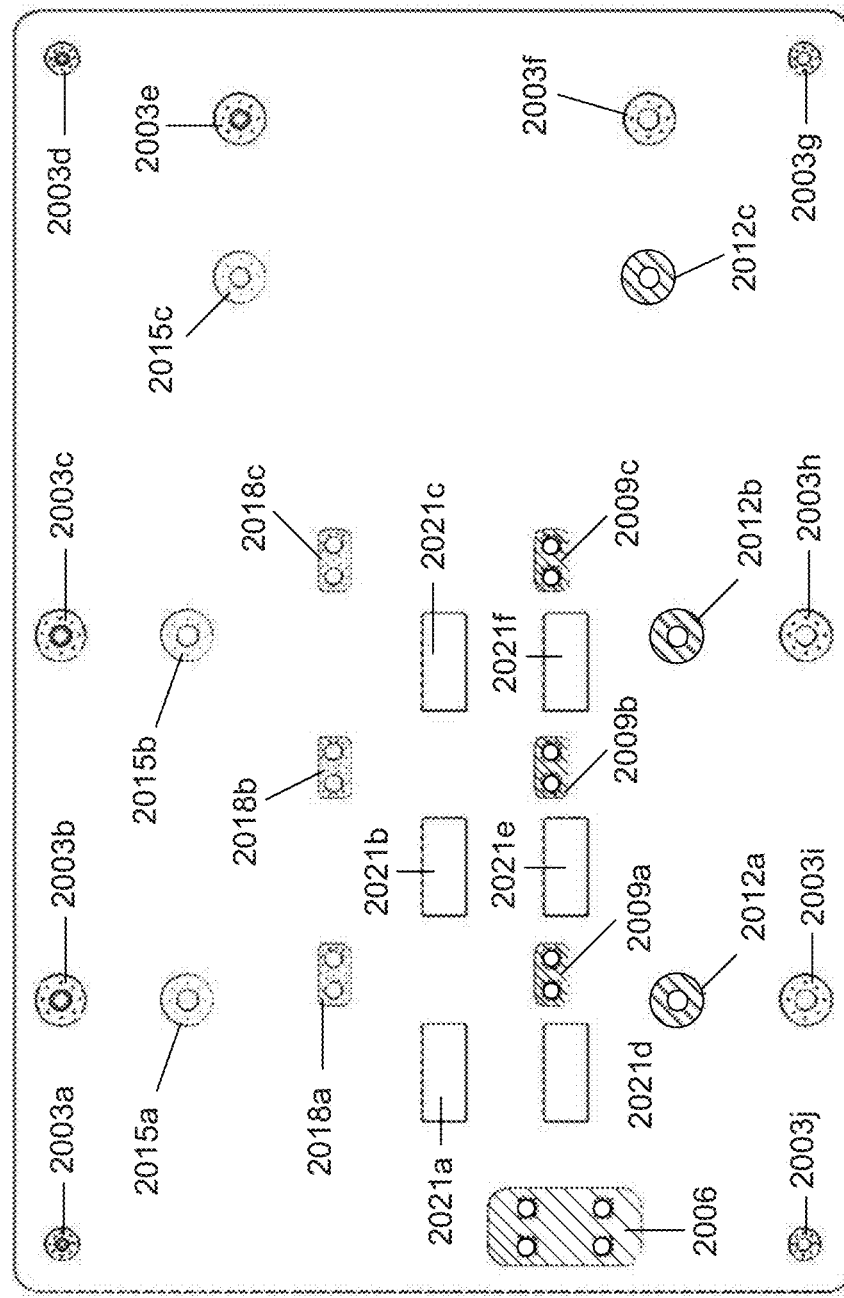
FIG. 20 illustrates a bird's eye view of the top surface of the PCB planar bus structure shown in FIG. 17.

FIG. 20 illustrates a bird's eye view of a top surface of the PCB planar bus 1700. As shown, the PCB planar bus 1700 includes a plurality of ground layer vias 2003a-2003j around edges of the top surface of the PCB planar bus 1700, which have exposed conductors that connect to the conductive ground layers 1706, 1710, and 1713. The PCB planar bus 1700 also includes a plurality of positive vias 2015a-2015c and 2018a-2018c, which have exposed conductors connected to the positive conductive layer 1709. The PCB planar bus 1700 also includes a plurality of negative vias 2006, 2009a-2009c, and 2012a-2012c, which have exposed conductors connected to the negative conductive layer 1712. These vias may be used to connect and supply power to a variety of capacitors and power modules in a power converter system. Specifically, positive vias 2018a-2018c and negative vias 2009a-2009c may be used to deliver power to power modules or a plurality of switching transistors such as MOSFETs, while output via 2006 may serve as a connection point to a load or bus output. Rectangular passthrough holes 2021a-2021f extend through the full thickness of the PCB planar bus 1700 and are not connected to any conductive layer. The rectangular passthrough holes 2021a-2021f allow gate drivers to pass through for connection to the power modules mounted below or above the bus structure 1700.

Figure 21:
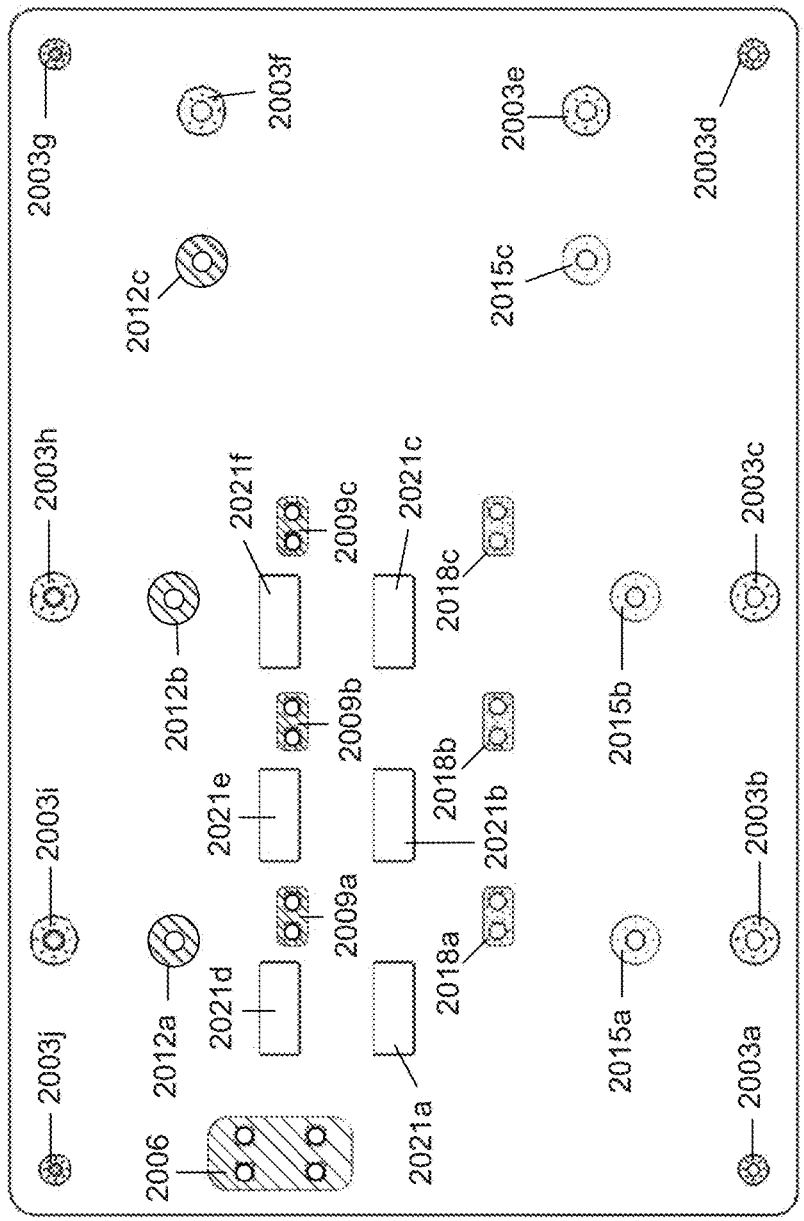
FIG. 21 illustrates a bird's eye view of the bottom surface of the PCB planar bus structure shown in FIG. 17.

FIG. 21 illustrates a bird's eye view of a bottom surface of the PCB planar bus 1700 as if the PCB bus 1700 shown in FIG. 20 is rotated about a vertical axis 180°, hence the symmetry of all the labeled vias. As such, the labeled vias of PCB bus structure 1700 may be accessible from above the PCB planar bus 1700 or below the PCB planar bus 1700.

Partial discharge measurements in air of the PCB planar bus 1700 may be tested with the high voltage (HV) of a power supply connected to the ground layers 1706, 1710, and 1713, and reference (REF) connections connected to the negative conductive layer 1712 and the positive conductive layer 1709. Using a 100 kV 60 Hz power supply, insulation quality of PCB planar bus 1700 can be tested to check for partial discharge (PD). With the HV and REF connections connected between the PCB planar bus 1700 using various combinations listed in Table III below, insulation between specific layers can be tested. A high frequency current transformer (HFCT) can be placed on the REF line to the PCB planar bus 1700 while the HV probe can be connected to various layers for testing purposes. Voltage can be gradually increased until discharge events appear on the oscilloscope.

TABLE III

Partial Discharge Inception Voltage Test Results

| High Voltage | Reference | Floating | Partial Discharge Inception Voltage (kV) | |
|---|---|---|---|---|
| | | | Air | Oil |
| +DC | −DC, MID | N/A | 7.52 | 9.28 |
| −DC | +DC, MID | N/A | 8.64 | 8.48 |
| MID | +DC, −DC | N/A | 6.72 | 8.64 |
| +DC | −DC | MID | 11.52 | 13.12 |
| +DC | MID | −DC | 6.88 | 9.76 |
| −DC | MID | +DC | 8 | 8.48 |

A partial discharge measurement in air was captured using an oscilloscope. The measurement was captured with a high voltage connected to MID or the ground layers 1706, 1710, and 1713, and a reference connected to the positive conductive layer 1709 and the negative conductive layer 1712, as shown in Table III above. Partial discharge inception voltage for this combination was measured to be 6.72 kV in air. As peak operating voltage for the PCB planar bus 1700 was less than half of the voltage tested before discharge events were measured, the PCB planar bus 1700 can be said to be partial discharge free.

Embodiments that include planar laminated bus structures have been described in this present disclosure. The design optimization steps provided herein are essential for designing PCB-based power bus structures that can fully leverage new and future generation WBG devices. High voltage PCB design is a relatively new area with many avenues for future research. Understanding core and prepreg material and construction, e.g. glass style, should be further evaluated to fully understand the implications of choosing one option over another. Various glass styles are available for the same material. Between glass styles, resin content may vary from 40% to as high as 72% which can cause individual layer thicknesses to vary from 1.3 mil to 6.8 mil. If not specified, a PCB manufacturer may use whatever thickness and glass style that is readily available for ease of use and cost reduction if there are no trace impedance requirements specified (which there will not be for a planar bus).

Considering an entire power converter system, replacement of larger decoupling capacitors and DC link capacitors with smaller distributed capacitors could result in a significant increase in overall converter power density and a reduction in weight. Overall, power converter modularity can be improved by incorporating these distributed capacitors on a daughter board which could then connect directly to a main bus. The embodiments presented herein can be extended to optimizing daughter boards and their connectors so that higher voltage capacitors can be created from lower voltage components.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

The term "substantially" is meant to permit deviations from the descriptive term that don't negatively impact the intended purpose. Descriptive terms are implicitly understood to be modified by the word substantially, even if the term is not explicitly modified by the word substantially.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about'y'".

Therefore, at least the following is claimed:

1. A laminated planar bus structure with stacked layers, comprising:
   a plurality of conductive layers arranged in a stack, the plurality of conductive layers comprising:
      a plurality of conductive ground layers, the plurality of conductive ground layers comprising an upper ground layer and a lower ground layer;
      a positive conductive layer with respect to the plurality of conductive ground layers, the positive conductive layer having a potential greater than the plurality of conductive ground layers;
      a negative conductive layer with respect to the plurality of conductive ground layers, the negative conductive layer having a potential less than the plurality of conductive ground layers; and
      a fifth conductive layer and a sixth conductive layer, wherein
      the upper ground layer and the lower ground layer are arranged as outer layers in the stack with respect to the positive conductive layer and the negative conductive layer, and the fifth and the sixth conductive layers are arranged as outer layers in the stack with respect to the upper ground layer and the lower ground layer;
   a plurality of insulation layers separating the plurality of conductive layers, wherein a middle insulation layer separating the positive conductive layer and the negative conductive layer is thicker than an upper insulation layer and a lower insulation layer in the laminated planar bus structure; and
   a plurality of apertures through at least one layer of the laminated planar bus structure, an exposed region of at least one of the plurality of conductive layers extending at least in part through at least one of the plurality of apertures.

2. The laminated planar bus structure of claim 1, wherein the laminated planar bus structure is constructed as a printed circuit board.

3. The laminated planar bus structure of claim 1, wherein a ratio of an insulation thickness of the middle insulation layer to an insulation thickness of one of the upper insulation layer or the lower insulation layer is about 2:1.

4. The laminated planar bus structure of claim 1, wherein the upper insulation layer and the lower insulation layer are substantially equal in thickness.

5. The laminated planar bus structure of claim 1, further comprising:
   a top insulation layer over the upper ground layer and the upper insulation layer in the stack; and
   a bottom insulation layer stacked under the lower ground layer and the lower insulation layer in the stack.

6. The laminated planar bus structure of claim 1, wherein the plurality of apertures comprise:
   a positive aperture with an exposed region of the positive conductive layer; and
   a negative aperture with an exposed region of the negative conductive layer.

7. The laminated planar bus structure of claim 1, wherein each of the plurality of conductive layers is formed of substantially equal thicknesses.

8. A planar bus structure with stacked layers, comprising:
   a plurality of conductive layers arranged in a stack, the plurality of conductive layers comprising:
      a plurality of conductive ground layers, the plurality of conductive ground layers comprising an upper ground layer, a middle ground layer, and a lower ground layer;
      a positive conductive layer with respect to the plurality of conductive ground layers, the positive conductive layer having a potential greater than the plurality of conductive ground layers; and
      a negative conductive layer with respect to the plurality of conductive ground layers, the negative conductive layer having a potential less than the plurality of conductive ground layers,
      wherein the upper ground layer and the lower ground layer are arranged as outer layers in the stack with respect to the positive conductive layer and the negative conductive layer,
      wherein the middle ground layer is arranged in the stack between the positive conductive layer and the negative conductive layer; and
   a plurality of insulation layers separating the plurality of conductive layers.

9. The planar bus structure of claim 8, further comprising a plurality of apertures through at least one layer of the planar bus structure, at least one of the plurality of apertures comprising an exposed region of at least one of the plurality of conductive layers.

10. The planar bus structure of claim 8, wherein the plurality of conductive layers arranged in the stack further comprise a sixth conductive layer and a seventh conductive layer, the sixth and the seventh conductive layers arranged as outer layers in the stack with respect to the upper ground layer and the lower ground layer.

11. The planar bus structure of claim 8, further comprising a plurality of passthrough holes extending from one surface of the planar bus structure to an opposite surface of the planar bus structure.

12. The planar bus structure of claim 8, further comprising an offset between one distal edge of the middle ground layer to a distal edge of the positive conductive layer.

13. The planar bus structure of claim 12, wherein the offset is at least about 1 millimeter.

14. The planar bus structure of claim 8, wherein a clearance between an edge of the planar bus structure to an edge of the middle ground layer is at least about 6 mm.

15. The planar bus structure of claim 8, wherein the plurality of insulation layers comprise a top insulation layer over the upper ground layer in the stack and a bottom insulation layer under the lower ground layer in the stack.

16. The planar bus structure of claim 8, further comprising straight bus terminals, bent bus terminals, or no bus terminals.

17. A power converter, comprising:
- a planar bus structure comprising a plurality of conductive layers arranged in a stack, the plurality of conductive layers comprising:
  - a plurality of conductive ground layers, the plurality of conductive ground layers comprising an upper ground layer, a middle ground layer, and a lower ground layer;
  - a positive conductive layer with respect to the plurality of conductive ground layers, the positive conductive layer having a potential greater than the plurality of conductive ground layers; and
  - a negative conductive layer with respect to the plurality of conductive ground layers, the negative conductive layer having a potential less than the plurality of conductive ground layers,
  - wherein the middle ground layer is arranged in the stack between the positive conductive layer and the negative conductive layer;
- a set of power modules connected to the positive conductive layer and the negative conductive layer; and
- a set of gate drivers connected to the set of power modules through passthrough holes in the planar bus structure.

18. The power converter of claim 17, wherein the upper ground layer and the lower ground layer are arranged as outer layers in the stack with respect to the positive conductive layer and the negative conductive layer.

19. The power converter of claim 17, wherein the set of power modules is arranged under the planar bus structure and the set of gate drivers is arranged over the planar bus structure.

* * * * *

UNITED STATES PATENT AND TRADEMARK OFFICE
CERTIFICATE OF CORRECTION

PATENT NO. : 11,335,649 B2
APPLICATION NO. : 16/879078
DATED : May 17, 2022
INVENTOR(S) : Jun Wang et al.

Page 1 of 1

It is certified that error appears in the above-identified patent and that said Letters Patent is hereby corrected as shown below:

In the Specification

Column 1, Lines 15-23 should read:
STATEMENT REGARDING FEDERALLY SPONSORED RESEARCH OR DEVELOPMENT
This invention was made with government support under grant number DE-EE0007305, awarded by the U.S. Department of Energy, and under grant number N00014-16-1-2939, awarded by Office of Naval Research. The government has certain rights in the invention.

Signed and Sealed this
Second Day of July, 2024

Katherine Kelly Vidal
*Director of the United States Patent and Trademark Office*